(12) United States Patent
Naito

(10) Patent No.: US 7,551,044 B2
(45) Date of Patent: Jun. 23, 2009

(54) ELECTRIC MACHINE SIGNAL SELECTING ELEMENT

(75) Inventor: Yasuyuki Naito, Kanagawa (JP)

(73) Assignee: Panasonic Corporation, Osaka (JP)

( * ) Notice: Subject to any disclaimer, the term of this patent is extended or adjusted under 35 U.S.C. 154(b) by 68 days.

(21) Appl. No.: 10/598,844

(22) PCT Filed: Jun. 13, 2005

(86) PCT No.: PCT/JP2005/010790

§ 371 (c)(1),
(2), (4) Date: Sep. 13, 2006

(87) PCT Pub. No.: WO2005/122395

PCT Pub. Date: Dec. 22, 2005

(65) Prior Publication Data

US 2007/0164839 A1   Jul. 19, 2007

(30) Foreign Application Priority Data

Jun. 14, 2004 (JP) ............................. 2004-175123
Jun. 10, 2005 (JP) ............................. 2005-170756

(51) Int. Cl.
*H03H 9/00* (2006.01)
(52) U.S. Cl. ...................................... 333/188; 333/197
(58) Field of Classification Search ......... 333/186–192, 333/197
See application file for complete search history.

(56) References Cited

U.S. PATENT DOCUMENTS 6,570,468 B2 * 5/2003 Ma et al. .................... 333/188

| 6,753,488 | B2 * | 6/2004 | Ono et al. ................ 200/181 |
| 6,788,175 | B1 * | 9/2004 | Prophet .................... 335/78 |
| 6,914,709 | B2 * | 7/2005 | Monroe et al. ............. 359/290 |
| 6,916,717 | B2 * | 7/2005 | Li et al. ................... 438/287 |
| 6,972,636 | B2 * | 12/2005 | Murata .................... 333/99 S |

FOREIGN PATENT DOCUMENTS

| JP | 2665106 | 6/1997 |
| JP | 2001-278700 | 10/2001 |
| JP | 2002-505046 | 2/2002 |
| JP | 2003-218666 | 7/2003 |
| JP | 2004-507921 | 3/2004 |
| JP | 2005-176318 | 6/2005 |

OTHER PUBLICATIONS

Wang et al., "1.14-GHz Self-Aligned Vibrating Micromechanical Disk Resonator", IEEE Radio Frequency Integrated Circuits Symposium, 2003, pp. 335-338.

* cited by examiner

*Primary Examiner*—Don P Le
(74) *Attorney, Agent, or Firm*—Pearne & Gordon LLP

(57) ABSTRACT

To provide an electromechanical signal selection device which can be miniaturized and highly integrated and which can selectively output only a signal of a predetermined frequency without providing any sensitive vibration sensing mechanism, and electric equipment using the electromechanical signal selection device.

A micro-vibrator serving as a resonator is provided. The micro-vibrator can be excited by an external force to excite vibration of the micro-vibrator. A material whose physical property is changed in accordance with a structural change is used as the micro-vibrator. Thus, a sensitive electromechanical signal selection device is obtained.

26 Claims, 15 Drawing Sheets

ELECTRIC MACHINE SIGNAL SELECTING ELEMENT

TECHNICAL FIELD

The present invention relates to an electromechanical signal selection device including an electromechanical filter, and particularly relates to a micro-vibrator serving as a resonator, a mechanism for exciting the micro-vibrator, or an electromechanical signal selection device in which a material having a physical property variable in accordance with a structural change is used as a micro-vibrator so as to make it possible to adjust the signal selection device characteristic.

BACKGROUND ART

With the progress in pervasion of information communication equipment such as wireless terminals, frequencies available for communications have been made broadband dramatically from several millions of hertz for cellular phones or the like to several gigahertz for wireless LAN or the like. Under current conditions, terminals supporting various communication systems are used independently. It is, however, expected to realize a wireless terminal supporting various communication systems by itself in the future.

In addition, with the progress in miniaturization of wireless terminals, it has been desired to miniaturize passive parts such as signal selection devices built in housings of the terminals. Particularly signal selection devices using electric resonance in LC or the like often used in wireless communications are difficult to miniaturize because the size of resonators depends on the electric length. Due to this problem, in recent years, novel principles of signal selection have been searched.

Of them, RF-MEMS signal selection devices which can be manufactured by MEMS (Micro Electro Mechanical Systems) technologies have been actively researched and developed. The RF-MEMS signal selection devices are electromechanical signal selection devices using mechanical vibrations of micro-vibrators. In an RF-MEMS signal selection device, since electric oscillation of a high frequency signal is transduced into mechanical vibration of a micro-vibrator and an output signal is extracted therefrom as electric oscillation again, there is an advantage that the size of a resonator does not depend on the electric length so that the signal selection device can be miniaturized. In addition, the RF-MEMS signal selection device can be manufactured in a process having good affinity to an RF-IC. It is therefore possible to build the signal selection device in the RF-IC. The RF-MEMS signal selection device is expected as a technique which will make a large contribution to miniaturization of a wireless unit.

For example, an electromechanical signal selection device using a GHz-band micro-vibrator is disclosed in Non-Patent Document 1. According to this Non-Patent Document 1, a micro-vibrator like a disc is arranged on a silicon substrate so as to realize an electromechanical resonator with a center frequency of 1.14 GHz using a mechanical resonance phenomenon of the micro-vibrator. The mechanism of signal selection will be described. By virtue of a high frequency signal input from a signal input port to a driving electrode, an electrostatic force is applied between the driving electrode and the micro-vibrator so as to excite the micro-vibrator with the frequency of the high frequency signal. When a signal with a frequency equal to the mechanical self-resonant frequency of the micro-vibrator is input, the micro-vibrator is excited so greatly that the electrostatic capacity changes in accordance with a change of the distance between the micro-vibrator and a sensing electrode. Then, due to a voltage applied to the micro-vibrator, the mechanical vibration of the micro-vibrator is extracted as electric oscillation by the sensing electrode, and output from the sensing electrode to a signal output port. That is, only a signal with a frequency set by the self-resonant frequency of the micro-vibrator can be output selectively.

Presently, there is an attempt to make the applicable frequency higher and make the Q value (Quality Factor) higher in electromechanical signal selection devices. In order to attain a high frequency in the applicable frequency, it is necessary to make the self-resonant frequency of a micro-vibrator higher. To this end, a method of reducing the size of the micro-vibrator or a method of using a harmonic mode of the micro-vibrator can be considered.

As the micro-vibrator becomes finer from a micrometer order to a nanometer order, vibration thereof becomes extremely slight and close to a noise level of quantum vibration or thermal vibration. It is therefore necessary to obtain a supersensitive vibration sensing method by which vibration close to a quantum limit can be sensed.

Non-Patent Document 1: J. Wang, et al., IEEE RFIC Symp., 8-10 June, pp. 325-338, 2003.

DISCLOSURE OF THE INVENTION

Problems that the Invention is to Solve

At present, however, when the self-resonant frequency of a micro-vibrator is made higher, the vibration amplitude of the micro-vibrator is reduced. Thus, there is a problem that a very slight change in electrostatic capacity produced between the micro-vibrator and a sensing electrode is difficult to sense as an electric signal output. In order to sense the very slight vibration of the micro-vibrator more sensitively, it is necessary to reduce the distance between the micro-vibrator and the sensing electrode or to increase a voltage VP applied to the micro-vibrator.

For example, in the electromechanical signal selection device disclosed in Non-Patent Document 1, a disc-type micro-vibrator having a radius of 20 µm and a thickness of 2 µm is formed by etching with a high aspect ratio, in which the depth is 3 µm while the distance between the micro-vibrator and the sensing electrode is 100 nm. When a smaller distance has to be set between the micro-vibrator and the sensing electrode in the future, it is expected that the manufacturing method will reach its critical limit. On the other hand, the voltage applied to the micro-vibrator ranges from 12.9 V to 30.54V. In the present circumstances, the voltage to be applied to a wireless terminal is high.

In order to make the applicable frequency of an electromechanical signal selection device higher, it is necessary to provide a method for performing signal selection in spite of a structure having no sensitive vibration sensing mechanism difficult to realize.

The present invention was developed in consideration of the foregoing situation. It is an object of the present invention to provide an electromechanical signal selection device which can selectively output only a signal of a predetermined frequency without providing any sensitive vibration sensing mechanism, and electric equipment using the electromechanical signal selection device.

Means for Solving the Problems

In order to attain an electromechanical signal selection device making it possible to perform signal selection even without providing any sensitive vibration sensing mechanism, according to the present invention, a change in physical property caused by a structural change of a micro-vibrator generated when the micro-vibrator vibrates with its self-resonant frequency is used as a mechanism of signal selection.

In order to solve the foregoing problems, an electromechanical signal selection device according to the present invention is characterized by including a micro-vibrator which can be excited by an input signal, and a post for retaining the micro-vibrator; wherein the micro-vibrator can generate a change in physical property due to excitation so as to change a selected signal.

With this structure, the micro-vibrator serving as a resonator can be excited by an external force. When a material whose physical property changes in accordance with the structural change is used as the micro-vibrator, signal selection can be performed. Thus, it is possible to obtain an electromechanical signal selection device with a signal selection function without providing any sensitive vibration sensing mechanism difficult to realize in the related art.

Here, the size of the micro-vibrator is not limited especially. It is assumed that the micro-vibrator is a vibrator formed in a micrometer order or a nanometer order by MEMS technologies.

The electromechanical signal selection device according to the present invention includes an electromechanical signal selection device in which the micro-vibrator is made of a material whose physical property is changed in accordance with a structural change.

With this configuration, it is possible to obtain a desired signal characteristic by changing the electric conductivity or the piezoelectric characteristic without providing any sensitive signal sensing mechanism.

The electromechanical signal selection device according to the present invention includes an electromechanical signal selection device in which the physical property is an electric conduction characteristic.

With this configuration, the electric conduction characteristic is changed directly in accordance with vibration. Thus, sensing becomes easy.

The electromechanical signal selection device according to the present invention includes an electromechanical signal selection device in which the micro-vibrator is retained by an electrode placed on the post.

With this configuration, distortion caused by vibration can be given to the micro-vibrator formed out of a material whose physical property changes in accordance with the structural change. Thus, it is possible to obtain a desired change in physical property.

The electromechanical signal selection device according to the present invention includes an electromechanical signal selection device in which a bonded surface between the electrode and the micro-vibrator is located at a distance from the post.

With this configuration, distortion caused by vibration can be given to the micro-vibrator as a whole. Thus, it is possible to obtain a desired change in physical property.

The electromechanical signal selection device according to the present invention includes an electromechanical signal selection device in which the rigidity of the post is lower than that of the micro-vibrator.

With this configuration, distortion caused by vibration can be given to the micro-vibrator as a whole. Thus, it is possible to obtain a desired change in physical property.

The electromechanical signal selection device according to the present invention includes an electromechanical signal selection device in which the micro-vibrator is formed of a multilayer structure of at least two layers including a material layer generating the change in physical property, and a conductor layer.

With this configuration, a high frequency signal flowing into the conductor layer chiefly can serve to excite the micro-vibrator, and a high frequency signal flowing into the phase change material layer can serve to perform signal selection in accordance with the change in physical property including electric conduction characteristic.

The electromechanical signal selection device according to the present invention includes an electromechanical signal selection device in which the conductor layer is formed to be linear, and a material layer generating the change in physical property is formed around the linear conductor layer.

With this configuration, by use of easiness to generate a phase change due to a large free surface on the outer side of the micro-vibrator, a high frequency signal flowing into the conductor layer located in the center portion chiefly can serve to excite the micro-vibrator, and a high frequency signal flowing into the phase change material layer can serve to perform signal selection in accordance with the change in physical property including electric conduction characteristic.

The electromechanical signal selection device according to the present invention includes an electromechanical signal selection device in which the material layer generating the change in physical property is formed on the side where an electric field of a signal is concentrated.

With this configuration, the phase change material layer is formed on the side where an electric field of a high frequency signal is concentrated. Accordingly, the effect of signal selection using a change in electric conduction characteristic of the phase change material layer can be increased.

The electromechanical signal selection device according to the present invention includes an electromechanical signal selection device in which the material layer generating the change in physical property is formed under the substrate side of the conductor layer.

With this configuration, the phase change material layer is formed on the substrate grounded side where an electric field of a high frequency signal is concentrated. Accordingly, the effect of signal selection using a change in electric conduction characteristic of the phase change material layer can be increased.

The electromechanical signal selection device according to the present invention includes an electromechanical signal selection device in which half the radius of the conductor layer is not larger than skin depth of a high frequency signal.

With this configuration, a high frequency signal to excite the micro-vibrator can flow into the material where the change in physical property occurs in spite of the material is in a state of an insulator. Since there is a characteristic called skin effect in which a higher-frequency signal flows more closely to the surface, the conductor layer may be formed into a shape in which at least half the radius thereof is not larger than the skin depth of the high frequency signal so that the signal power attenuation factor is increased. Thus, the signal is allowed to pass when the micro-vibrator vibrates so that the micro-vibrator as a whole including the phase change material layer is in a low resistance state. In this case, the micro-vibrator may be formed into a shape in which at least the radius thereof is not smaller than the skin depth of the high frequency signal so that the signal power attenuation factor is reduced.

The electromechanical signal selection device according to the present invention includes an electromechanical signal selection device in which the micro-vibrator is made of perovskite type transition metal oxide.

The electromechanical signal selection device according to the present invention includes an electromechanical signal selection device in which the perovskite type transition metal oxide is $PrNiO_3$ showing metal-insulator transition.

The electromechanical signal selection device according to the present invention includes an electromechanical signal selection device in which the micro-vibrator is made of a piezoresistive effect material.

The electromechanical signal selection device according to the present invention includes an electromechanical signal selection device in which the micro-vibrator is made of at least one of Si, $La_{1-x}Sr_xMnO_3$ and $BaTiO_3$.

The electromechanical signal selection device according to the present invention includes an electromechanical signal selection device in which the micro-vibrator is made of a superconductor.

The electromechanical signal selection device according to the present invention includes an electromechanical signal selection device in which the superconductor is one of Al, Pb, $La_{2-x}Sr_xCuO_4$ and $(BEDTTTF)_2I_3$.

The electromechanical signal selection device according to the present invention includes an electromechanical signal selection device in which the micro-vibrator is made of a carbon-based material.

The electromechanical signal selection device according to the present invention includes an electromechanical signal selection device in which the input signal is supplied through an electrode provided in the micro-vibrator.

The electromechanical signal selection device according to the present invention includes an electromechanical signal selection device in which the input signal is supplied through a driving electrode disposed adjacently to the micro-vibrator.

The electromechanical signal selection device according to the present invention includes an electromechanical signal selection device in which an external force to be applied to the driving electrode is an electrostatic force.

The electromechanical signal selection device according to the present invention includes an electromechanical signal selection device in which a mechanism for applying an external magnetic field to the micro-vibrator is provided to excite the micro-vibrator due to a Lorentz force.

The electromechanical signal selection device according to the present invention includes an electromechanical signal selection device in which a mechanism for applying an external magnetic field is provided in a driving electrode or a signal input electrode disposed adjacently to the micro-vibrator so as to excite vibration of the micro-vibrator in a desired direction.

With this configuration, a mechanism for applying an external magnetic field is provided in a driving electrode disposed adjacently to the micro-vibrator or the micro-vibrator. Due to disposition of the driving electrode or the mechanism for applying an external magnetic field, an external force for exciting vibration of the micro-vibrator in a desired direction can be applied.

The electromechanical signal selection device according to the present invention includes an electromechanical signal selection device in which the change in physical property is caused by piezoelectric effect.

The electromechanical signal selection device according to the present invention includes an electromechanical signal selection device in which the micro-vibrator is designed to generate a signal by virtue of the piezoelectric effect when the micro-vibrator is excited to generate a structural change.

The electromechanical signal selection device according to the present invention includes an electromechanical signal selection device in which the micro-vibrator is made of ceramics.

The electromechanical signal selection device according to the present invention includes an electromechanical signal selection device in which the micro-vibrator is made of PZT.

With these configurations, the micro-vibrator can be formed easily by a sputtering method or the like. Thus, manufacturing is easy.

Effect of the Invention

As described above, according to the present invention, a change in physical property caused by a structural change of a micro-vibrator generated when the micro-vibrator vibrates with its self-resonant frequency is used as a mechanism for signal selection. Accordingly, only a signal with a predetermined frequency can be selectively output.

Since it is not necessary to provide any sensitive vibration sensing mechanism, an electromechanical signal selection device with a high frequency signal selection function, which can manufactured with a simple structure and at a low cost is produced.

A mechanism for giving an external force to the micro-vibrator to thereby excite vibration therein is also dispensable. Further, the structure becomes simple. Thus, the electromechanical signal selection device can be manufactured at a low cost.

The electromechanical signal selection device according to the present invention is applicable not only to an electric circuit for wireless communication but also to electric circuits for various applications.

The electromechanical signal selection device according to the present invention can be also used as a resonator. Therefore, the electromechanical signal selection device can be used in an oscillator, and in a block of an electric circuit such as a mixer or an amplifier.

Figure 1A:
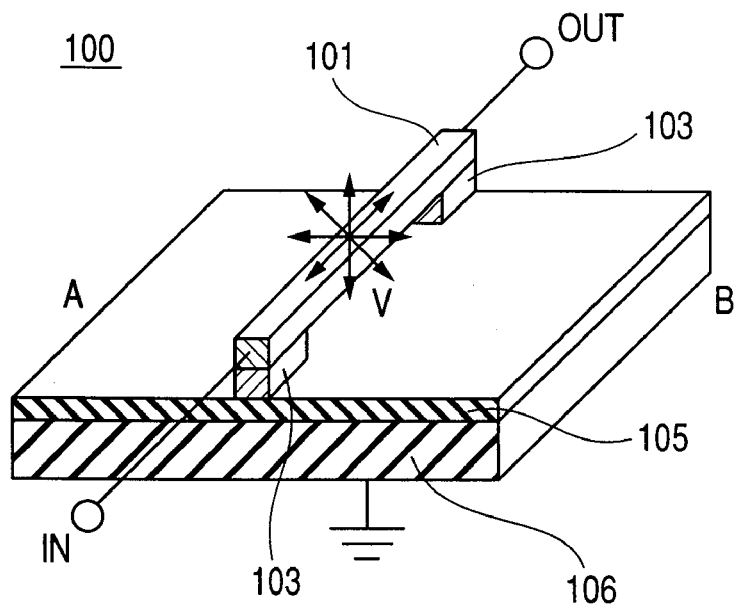
[FIG. 1] (a) is a perspective view showing the configuration of an electromechanical signal selection device according to Embodiment 1 of the present invention, and (b) is a perspective view showing a modification of the electromechanical signal selection device in FIG. 1(a).

DESCRIPTION OF REFERENCE NUMERALS 100200,300,400,500,600,700,800,2000,2001,2002 electromechanical signal selection device
101,1011,1012 micro-vibrator
102 driving electrode
103 post
104 spacer
105 insulating layer
106 substrate
107 lattice
108 photo-resist
109 signal input electrode
201 electrode
202 phase change material
203 conductor

BEST MODE FOR CARRYING OUT THE INVENTION

Respective embodiments of the present invention will be described below in detail with reference to the drawings.

Embodiment 1

FIG. 1(a) is a perspective view showing the configuration of an electromechanical signal selection device according to Embodiment 1 of the present invention, in which $PrNiO_3$ is used as a micro-vibrator 101. In the electromechanical signal selection device 100 shown in FIG. 1(a), the micro-vibrator 101 bridged between posts 103 is provided on a substrate 106 having an insulating layer 105 in a surface and connected to the ground. A signal input port IN for signal input and a signal output port OUT for signal output are connected to the micro-vibrator 101. There is formed a mechanism in which when a high frequency signal is input to this signal input port IN, there occurs a potential difference between the micro-vibrator 101 and the substrate 106 so that an electrostatic force is applied to the micro-vibrator 101 with the same frequency as that of the high frequency signal.

Next, description will be made on the mechanism of signal selection by the micro-vibrator in this electromechanical signal selection device 100. A signal input from the signal input port IN propagates to the micro-vibrator 101 so as to excite the micro-vibrator 101 with the frequency of the high frequency signal. Only when a signal corresponding to the self-resonant frequency of the micro-vibrator 101 is input, the micro-vibrator 101 is excited with large amplitude so as to produce structural deformation of the micro-vibrator 101. The vibration of the micro-vibrator 101 can be used up to a harmonic mode of the self-resonant frequency. The vibrating direction of the micro-vibrator 101 varies in accordance with the vibration mode excited. The vibrating direction of the micro-vibrator 101 is designated by V. In this structure, the vibrating direction V is multidirectional, as shown in FIG. 1.

As the micro-vibrator 101 is more ultramicroscopic in size and smaller in vibration amplitude, it is more difficult to extract a signal according to a related-art electromechanical signal selection device vibration sensing method in which a variation of the vibration amplitude is sensed electrically. Therefore, in the electromechanical signal selection device 100 according to the present invention, a novel system is introduced as follows. That is, when the micro-vibrator 101 vibrates with its self resonant frequency, the physical properties vary due to the structural change of the micro-vibrator 101. Thus, a signal is selected. In this Embodiment 1, the electromechanical signal selection device 100 is designed so that a change of electrical conduction properties occur as the change of physical properties.

Figure 2A:
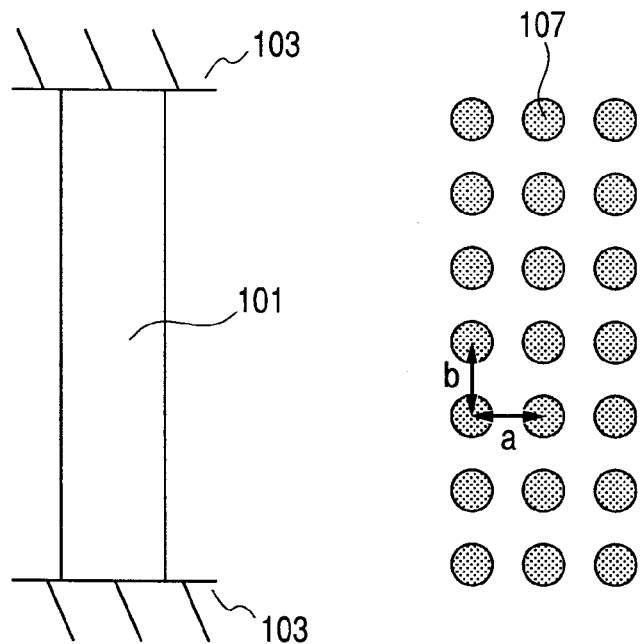
[FIG. 2] Diagrams showing structural deformation of a micro-vibrator in the electromechanical signal selection devices according to Embodiment 1, Embodiment 2 and Embodiment 3 of the present invention: in which (a) is a diagram showing a stationary state of the micro-vibrator; and (b) is a diagram showing a vibrating state of the micro-vibrator.
Figure 2B:
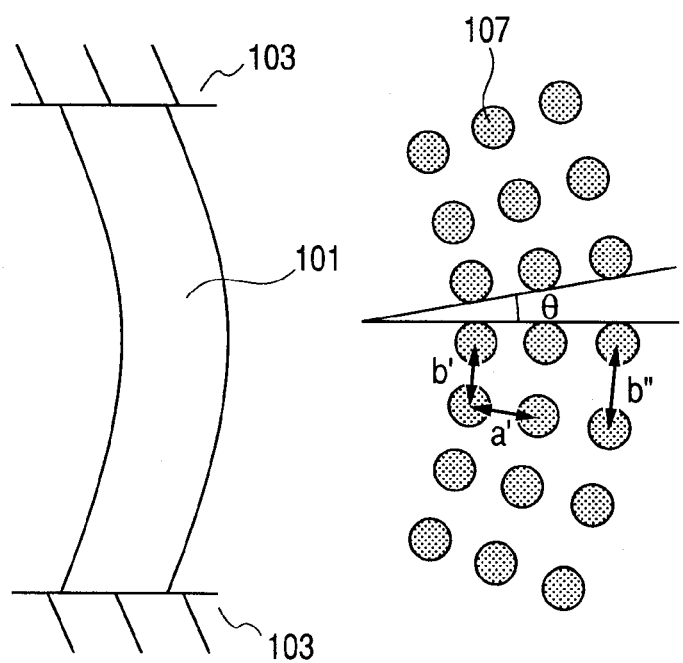

FIG. 2 are diagrams showing structural deformation of the micro-vibrator of the electromechanical signal selection device in Embodiment 1 of the present invention. In the state where the micro-vibrator 101 is not vibrating, as shown in FIG. 2(a), the structure of the micro-vibrator 101 is in a straight-line stationary state, and the crystal structure is also in an undistorted state where lattices 107 are arranged regularly with a lattice constant (a, b). On the other hand, in the state where the micro-vibrator 101 is excited with its self-resonant frequency, as shown in FIG. 2(b), the structure of the micro-vibrator 101 is in a curved vibrating state, and the crystal structure is in a distorted state where the lattices are arranged irregularly. In this case, the lattice constant has a value (a', b') varying locally so that the value becomes irregular to be b' in one site and b" in another site.

Figure 3A:
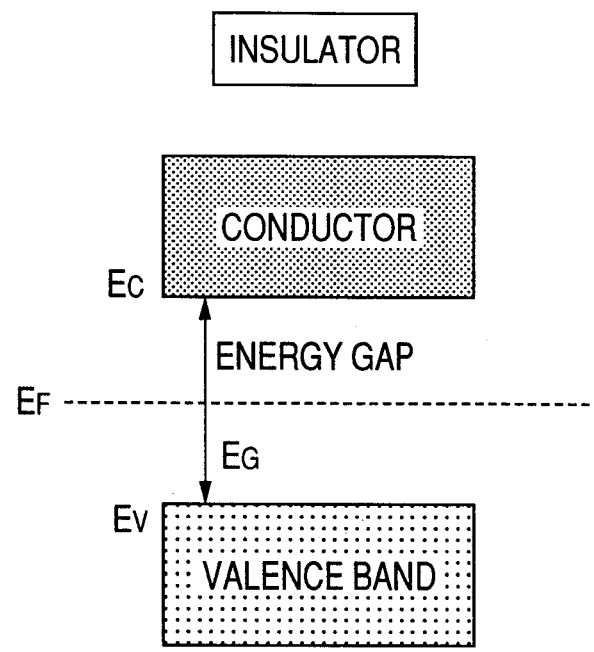
[FIG. 3] Diagrams showing the electron band structure of a micro-vibrator of the electromechanical signal selection device according to Embodiment 1 of the present invention: in which (a) is a diagram showing a stationary state of the micro-vibrator; and (b) is a diagram showing a vibrating state of the micro-vibrator.
Figure 3B:
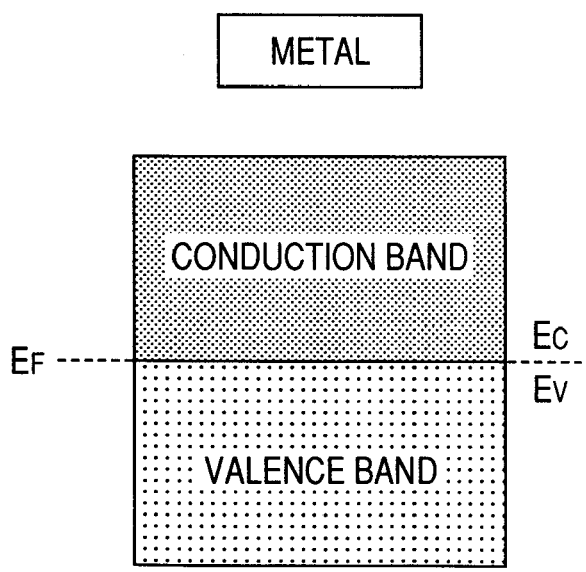

In the electromechanical signal selection device 100 according to the present invention, a change of the electric conduction characteristic of the micro-vibrator 101 caused by a structural change of the micro-vibrator 101 is used as a mechanism for signal selection. To this end, a material whose electron band structure changes in accordance with the structural change is used as the micro-vibrator 101. FIG. 3 are diagrams showing the electron band structure of the material forming the micro-vibrator of the electromechanical signal selection device according to Embodiment 1 of the present invention. FIG. 3(a) shows the electron band structure of the micro-vibrator 101 in the stationary state where the micro-vibrator 101 is not vibrating. In the state where no distortion occurs in the crystal structure of the micro-vibrator 101, the electric conduction characteristic of the micro-vibrator 101 is insulative. In the electron band structure, a large energy gap $E_G$ is open between a valence band and a conduction band. Fermi energy $E_F$ contributing to electric conduction is located in the energy gap $E_G$. Thus, the electron band structure serves as an insulator in which electrons cannot move. On the other hand, FIG. 3(b) shows the electron band structure of the micro-vibrator 101 in the vibrating state where the micro-vibrator 101 is excited with its self-resonant frequency. In the state where distortion occurs in the crystal structure of the micro-vibrator 101, the electron band structure of the micro-vibrator 101 changes into a metal structure due to the distortion, and the electric conduction characteristic becomes conductive. The energy gap $E_G$ having been located between the valence band and the conduction band disappears so that an electron band of the conduction band ranges over the Fermi energy EF contributing to electric conduction. Thus, the electron band structure changes into a metallic electron band structure in which electrons can are conducted.

When a signal with a frequency not equal to the self-resonant frequency of the micro-vibrator 101 is input from the signal input port IN, the micro-vibrator 101 is in a stationary state where the micro-vibrator 101 is not vibrating. Thus, the micro-vibrator 101 has an electron band structure serving as an insulator, and the electric conduction characteristic thereof is insulative. In this case, the signal cannot flow into the micro-vibrator 101. Thus, the signal is not output to the signal output port OUT. On the other hand, when a signal with a frequency equal to the self-resonant frequency of the micro-vibrator 101 is input from the signal input port IN, the micro-vibrator 101 is brought into a vibrating state where the micro-vibrator 101 is excited. Thus, the electric conduction characteristic thereof becomes metallic. In this case, the signal can flow into the micro-vibrator 101. Thus, the signal is output to the signal output port OUT. That is, only when a signal with a frequency equal to the self-resonant frequency of the micro-vibrator 101 is input from the signal input port IN, a signal with the same frequency can selectively pass to the signal output port OUT.

Figure 4A:
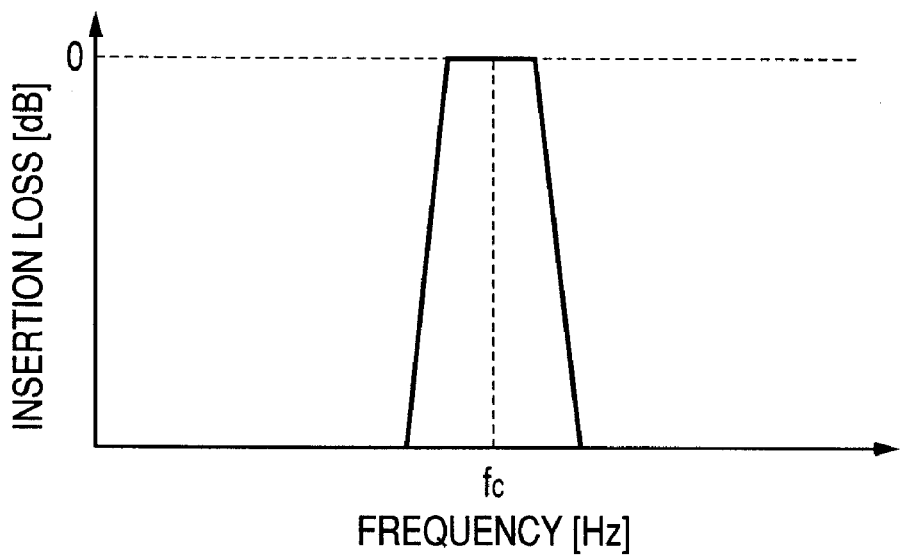
[FIG. 4] Graphs showing the signal selection device ring characteristic of the electromechanical signal selection devices according to Embodiment 1, Embodiment 2 and Embodiment 3 of the present invention: in which (a) is a graph showing a band stop signal selection device characteristic; and (c) is a graph showing a band stop signal selection device characteristic.

FIG. 4(a) is a graph showing the signal selection characteristic of the electromechanical signal selection device according to Embodiment 1 of the present invention. The electromechanical signal selection device can have a band-pass signal selection device characteristic with a center frequency $f_c$. The center frequency $f_c$ and a Q value depend on the design of the micro-vibrator 101, and are decided by the self-resonant frequency and the Q value of the micro-vibrator 101.

In this embodiment, the aforementioned $PrNiO_3$ is used as the material used as the micro-vibrator 101 and having an electron band structure changing due to a structural change. $PrNiO_3$ is ceramics, in which metal-insulator transition occurs due to distortion of the crystal structure so that a dramatic change in electric conduction characteristic occurs in the same material. The perovskite type transition metal oxide $PrNiO_3$ is a material in which transition from an insulator to metal can be seen. When Pr is replaced by ion having a smaller ionic radius so as to increase the distortion, the band gap can be increased. When crystal distortion is mechanically excited in such a material by an external force, there occurs a change in electric conduction characteristic due to a change of the electron band structure.

Here, an example of the relationship between the structural change of the micro-vibrator 101 and the electric conduction characteristic thereof has been described. However, the electric conduction characteristic is not limited to insulative one when the micro-vibrator 101 is not vibrating, that is, the micro-vibrator 101 is in a stationary state. It will go well if the electric conduction characteristic is in a high-impedance state such as a semiconductor state, a high-resistance metal state, or the like. In the vibrating state where the micro-vibrator 101 is excited, the electric conduction characteristic is not limited to metallic one. It will go well if the electric conduction characteristic is in a low-impedance state such as a low-resistance semiconductor state or the like.

In this embodiment, a dual-supported beam is used as the micro-vibrator 101. However, a micro-vibrator 101 in which a disc 101C is disposed at the center as shown in a modification of FIG. 1(b) may be used.

Figure 1B:
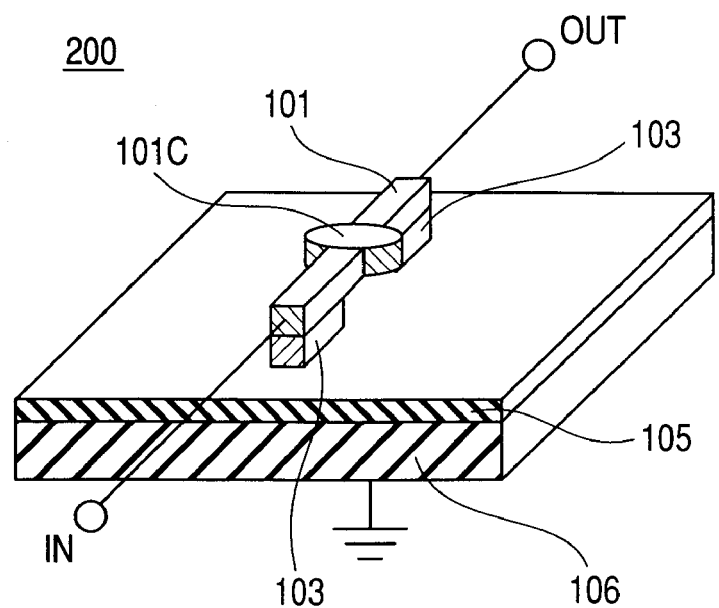

FIG. 1(b) is a perspective view showing a modification of the electromechanical signal selection device in FIG. 1(a). In the electromechanical signal selection device 100, the micro-vibrator is formed as a dual-supported beam. However, in an electromechanical signal selection device 200 shown in FIG. 1(b), a disc 101C is disposed in the center of a micro-vibrator as the micro-vibrator 101 so that the sensitivity can be improved. Moreover, the shape of the micro-vibrator 101 can be changed suitably into a cantilever, a square board, or the like. In the electromechanical signal selection device 200 in FIG. 1(b), constituents similar to those in the electromechanical signal selection device 100 shown in FIG. 1(a) are named and referenced correspondingly, and description thereof will be omitted.

Figure 4B:
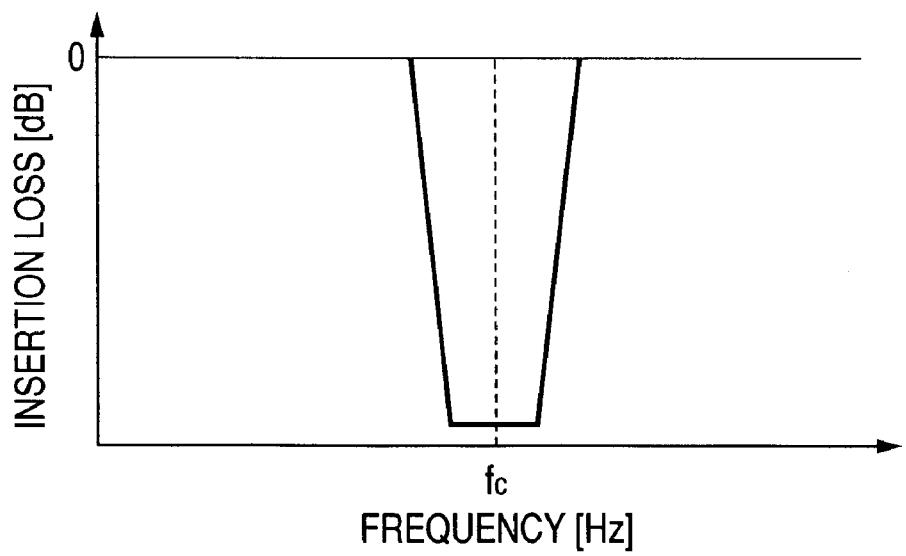

In the electromechanical signal selection device according to Embodiment 1 of the present invention, a material having a negative correlation between its structural change and its electric conduction characteristic, that is, a material showing low impedance like metal, low-resistance semiconductor or the like in a stationary state and high impedance like insulator, semiconductor, high-resistance metal or the like in a vibrating state, may be used as the micro-vibrator 101. Thus, the electromechanical signal selection device can have a band stop signal selection device characteristic at a center frequency $f_c$ as shown in FIG. 4(b).

A power amplifier etc. for amplifying the power of an output signal can be provided on the signal output port OUT side.

When a plurality of micro-vibrators combined mechanically are used, it is possible to control the Q value of the signal selection characteristic or the signal pass bandwidth.

Electromechanical signal selection devices according to the present invention may be connected in parallel or in series to form a multistage signal selection device configuration.

Here, description will be made on a method for manufacturing the electromechanical signal selection device 100. The manufacturing process of the electromechanical signal device 200 shown in FIG. 5 is similar to that of the electromechanical signal selection device 100, except for the shape of a mask pattern.

Figure 5A:
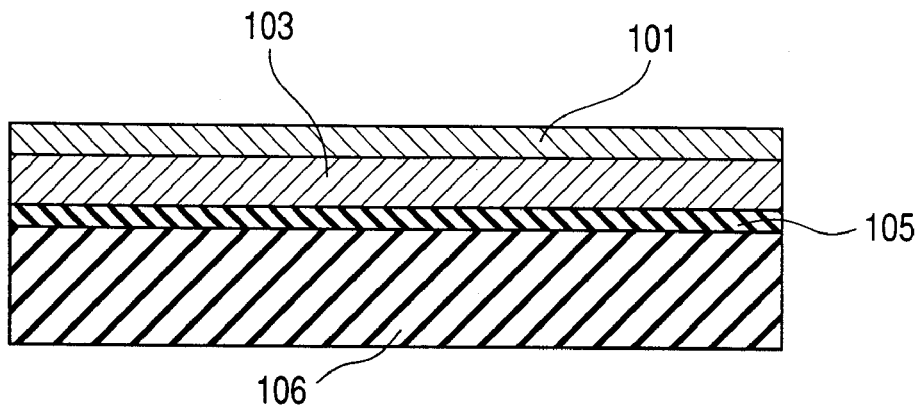
[FIG. 5] Sectional views for stepwise explaining a manufacturing process of the electromechanical signal selection device in FIG. 1 according to Embodiment 1 of the present invention.
Figure 5B:
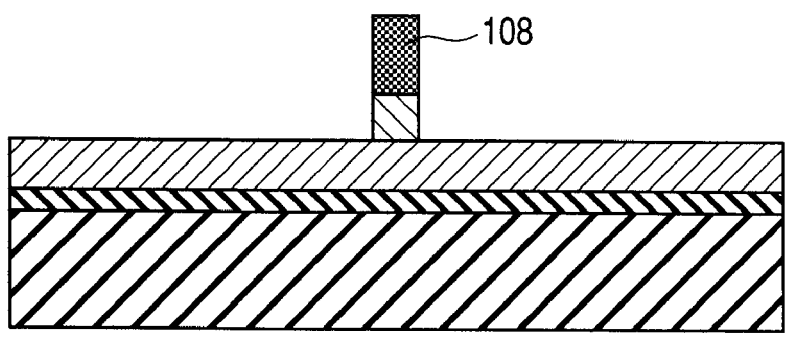
Figure 5C:
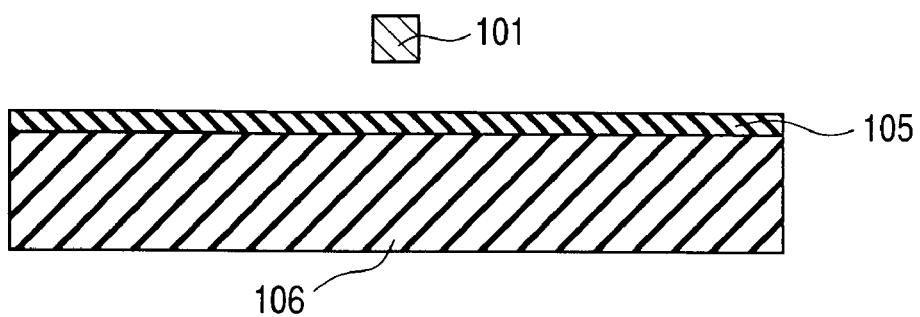

FIGS. 5(*a*)-(*c*) are sectional views taken on line A-B in FIG. 1(*a*) showing the electromechanical signal section device according to Embodiment 1 of the present invention. FIGS. 5(*a*)-(*c*) stepwise explain the manufacturing process of the electromechanical signal section device. First, as shown in FIG. 5(*a*), an insulating layer 105 of $SiO_2$, $Si_3N_4$ or the like is formed on a substrate 106 made of Si in a thermal oxidation method, a sputtering method or the like. Next, an insulating material of $SiO_2$, $Si_3N_4$ or the like serving as posts 103 is formed in a sputtering method, a CVD (Chemical Vapor Deposition) method or the like. Further, a material ($PrNiO_3$ here) serving as a micro-vibrator 101 is deposited thereon in a sputtering method, a CVD method or the like. As shown in FIG. 5(*b*), a photo-resist 108 is formed on the material serving as the micro-vibrator 101, and patterned by electron-beam lithography, photo-lithography or the like. A pattern of the micro-vibrator 101 is shaped by dry etching. Finally, the photo-resist 108 is removed by ashing, and the insulating material under the micro-vibrator 101 also having a function as a sacrificial layer is removed by selective wet etching with the material serving as the micro-vibrator 101. Thus, an aerial structure of the micro-vibrator 101 as shown in FIG. 5(*c*) is produced. HF or the like is used as etchant. In addition, after the selective wet etching, $CO_2$ supercritical drying is performed to avoid contact of the aerial structure with the substrate.

Although $PrNiO_3$ is used as the micro-vibrator 101 in the embodiment, the micro-vibrator 101 is not limited to $PrNiO_3$. For example, semiconductors such as Si (poly-Si, single-crystal Si, doped Si (P type or N type), Ga, GaAs, GaAsP, InGaAs, GaN, AlGaN, SiC, etc. can be applied. The substrate is not limited to Si, either. Compound semiconductors such as GaAs, GaAsP, InGaAs, GaN, AlGaN, etc. can be applied.

When crystal distortion is given to a semiconductor, its electron band structure can be changed so that the electric conduction characteristic can be changed. For example, when Si is doped with impurities such as boron, phosphorus, etc., the resistivity or the Young's modulus can be adjusted. Further, when the composition ratio of a compound semiconductor is adjusted and a dopant is adjusted, a desired band gap and a variation of the electric conductivity can be adjusted. SiC has a characteristic that when crystal distortion is given to SiC, the drift velocity is increased to improve the electric conductivity as compared with SiC having no distortion. When $SiO_2$ is formed around a nano-wire of Si having an electron band structure serving as a one-dimensional system and enormous stress is applied thereto, crystal distortion occurs so that the electron band structure is apt to change largely. Stress of 2 GPa can attenuate a band gap of 150 meV.

In a carbon-based material such as a carbon nanotube or the like, a difference in structure leads to a change in electric conduction characteristic. In a carbon nanotube, the electric conduction characteristic is metallic or semiconductor in accordance with the way to wind a graphene sheet (chirality). In a semiconductor carbon nanotube, an electron band structure with a very small energy gap (2 or 3 meV) or a middle energy gap (0.2-0.3 eV) can be seen. When various materials are injected into a carbon nanotube so as to form a peapod, the electron band structure of the carbon nanotube can be controlled. Examples of materials to be injected include atoms such as cesium (Cs) etc., and molecules such as fullerene C60, heteroatom containing fullerene, organic materials, etc. In a single-layer carbon nanotube which contains gadolinium metal containing fullerene Gd@C82, the band gap is 0.42 eV in a portion having no Gd@C82 while the band gap is narrowed locally to be 0.17 eV in a portion where Gd@C82 is present. Carbon-based materials such as carbon nanotubes are materials whose electron band structures change largely in accordance with their structures. When crystal distortion is mechanically excited in such a material by an external force, there occurs a change in electric conduction characteristic due to a change in electron band structure.

Semiconductors such as Si, metal thin-film resistors or ceramics such as $La_{1-x}Sr_xMnO_3$ and $BaTiO_3$ have a characteristic (piezoresistive effect) in which the resistance changes in accordance with the magnitude of distortion. Perovskite type manganate $La_{1-x}Sr_xMnO_3$ shows a comparatively high piezoresistive effect at a room temperature in X=0.25. When distortion is given to perovskite type manganate $La_{1-x}Sr_xMnO_3$ in 150 MPa, the resistivity changes by 7%. This is the case where 20 wt % of $La_{1-x}Sr_xMnO_3$ is dispersed into zirconia ($ZrO_3$) in order to make the structure have high strength. When the dispersion quantity is changed, the piezoresistive effect or the strength can be controlled so that the variation of the resistivity or the resonance frequency and amplitude (distortion magnitude) of the structure can be changed. It is also effective to laminate and adjust materials having different compositions so that a desired variation of resistivity and a desired resonance frequency can be obtained.

In ceramics such as semiconductor $BaTiO_3$, there appears a great piezoresistive effect. When compression distortion of $2.5 \times 10^{-4}$ is mechanically given to a rod-like device with a diameter of 10-20 μm in which a single polarization zone is formed in a ferroelectric substance, there occurs a large resistance change from about 300 Ωcm to 3 kΩcm in 5 V, and from about 3 kΩcm to 3 MΩcm in 0.01 V. Since a resistance variation of one or more digits appears, a large ON/OFF ratio essential in a signal selection device can be obtained. This material can be formed in a simple and easy process such as a sol-gel process.

Furthermore, superconductors such as Al, Pb, $La_{2-x}Sr_xCuO_4$, $(BEDTTTF)_2I_3$, etc. are also effective. In a superconductive metal such as Al or the like, the electric conduction characteristic transfers to superconductor with zero electric resistance due to distortion of a crystal lattice. In order to obtain a superconductor, it is necessary to form a Cooper pair out of two electrons. That is caused by the distortion of the crystal lattice. When positive Ions located in lattice points are collected by the crystal distortion, positive polarity is intensified locally there so as to attract negative electrons. Thus, an electron structure in which a Cooper pair is formed can be obtained. In a copper oxide high-temperature superconductor such as $La_{2-x}Sr_xCuO_4$ or the like, a complicated phase diagram including a transition from an insulator to a superconductor can be seen. When distortion is mechanically given to the crystal structure, the electric conduction characteristic can be controlled.

A composite material having quantum dots or the like implanted is also effective. When crystal distortion is given to a composite material having quantum dots or the like implanted, the electron band structure of the quantum dots is changed so that the electric conduction characteristic can be changed. As for a composite material where InGaAs quantum dots are implanted in GaAs, when a dual-supported beam manufactured by MEMS technology is bent by an external force so as to excite crystal distortion, there appears a change in electron band structure due to distortion of the quantum dots.

In addition, materials as will be described below are also applicable because they show a change in electric conduction characteristic due to crystal distortion.

Also applicable are organic materials such as (DMe-DC-NQI)$_2$Cu, carbon-based materials such as carbon nanotubes, superlattice materials having a plurality of materials laminated, metals such as Al, Au and Cu, insulating materials such as SiO$_2$ and Si$_3$N$_4$, magnetic materials such as Ni, dielectric materials such as PZT, etc.

Figure 6A:
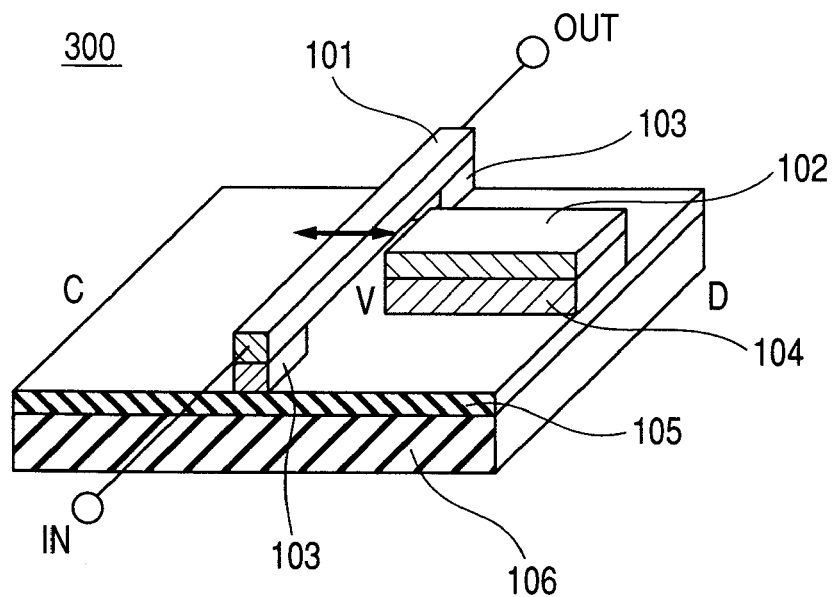
[FIG. 6] (a) is a perspective view showing a modification of the electromechanical signal selection device according to Embodiment 1 of the present invention, and (b) is a perspective view showing a modification of the electromechanical signal selection device in FIG. 6(a).

Although the vibrating direction of the micro-vibrator was not defined in the aforementioned Embodiment 1, a driving electrode 102 may be disposed so that an external force to excite vibration in a desired direction can be applied to the micro-vibrator. FIG. 6 are perspective views showing modifications of the electromechanical signal selection devices in FIG. 1 according to Embodiment 1 of the present invention. In an electromechanical signal selection device 300 shown in FIG. 6(a), a micro-vibrator 101 bridged between posts 103 and a driving electrode 102 provided on a spacer 104 are provided on a substrate 106 having an insulating layer 105 formed on the surface thereof. A signal input port IN for signal input and a signal output port OUT for signal output are connected to the micro-vibrator 101 so as to form a mechanism as follows. That is, when a high frequency signal is input, a potential difference occurs between the micro-vibrator 101 and the driving electrode 102 so that an electrostatic force is applied to the micro-vibrator 101 with the same frequency as that of the high frequency signal. The vibrating direction of the micro-vibrator 101 is designated by V. FIG. 6(a) shows the case where the vibrating direction V of the micro-vibrator 101 is horizontal with respect to the substrate. However, the vibrating direction can be set to be various directions including a vertical direction. The driving electrode 102 can be disposed to apply the exciting force to the micro-vibrator in a desired direction.

Figure 6B:
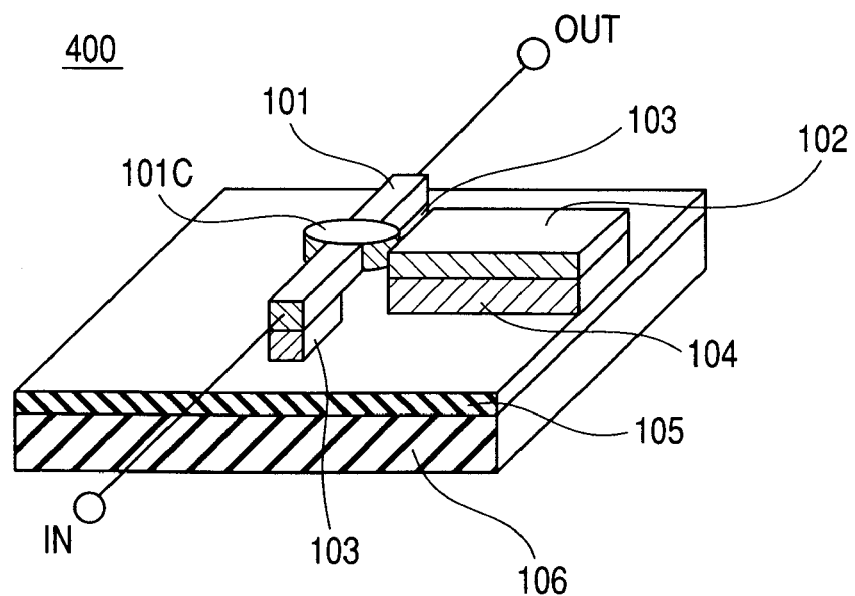

FIG. 6(b) is a perspective view showing a modification of the electromechanical signal selection device in FIG. 6(a). A dual-supported beam was used as the micro-vibrator 101 in the electromechanical signal selection device 300. However, in an electromechanical signal selection device 400 shown in FIG. 6(b), a disc is used by way of example. In such a manner, various other shapes such as a cantilever, a square board, etc. can be used as the micro-vibrator 110. In the electromechanical signal selection device 400 in FIG. 6(b), constituents similar to those in the electromechanical signal selection device 300 shown in FIG. 6(a) are named and referenced correspondingly, and description thereof will be omitted.

Figure 7A:
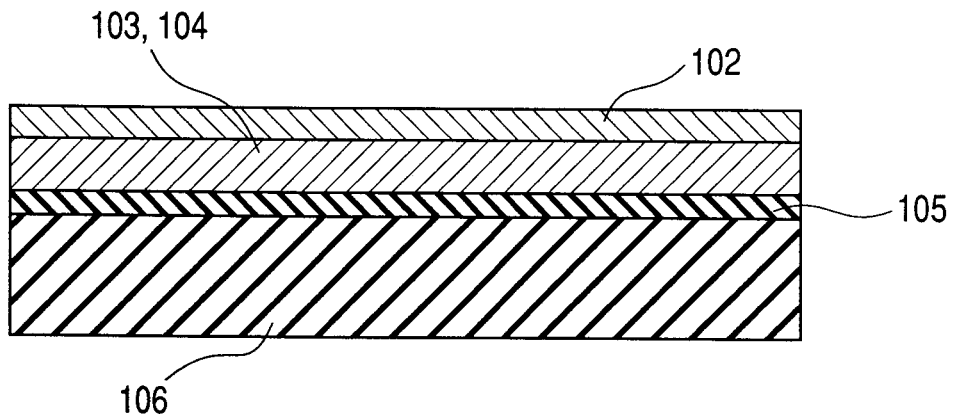
[FIG. 7] Sectional views for stepwise explaining a manufacturing process of the electromechanical signal selection device in FIG. 6 according to Embodiment 1 of the present invention.

Here, description will be made on a method for manufacturing the electromechanical signal selection device 300. Incidentally, a method for manufacturing the electromechanical signal selection device 400 shown in FIG. 6(b) is the same as that of the electromechanical signal selection device 300, except that there is a slight difference in a mask pattern. FIGS. 7(a)-(c) and FIGS. 8(a)-(b) are sectional views taken on line C-D in FIG. 6(a) showing the electromechanical signal section device according to a modification of Embodiment 1 of the present invention. FIGS. 7(a)-(c) and FIGS. 8(a)-(b) stepwise explain the manufacturing process of the electromechanical signal section device. First, as shown in FIG. 7(a), an insulating layer 105 of SiO$_2$, Si$_3$N$_4$ or the like is formed on a substrate 106 of Si or the like by thermal oxidation, sputtering, or the like. Likewise, here, not only Si but also compound semiconductors such as GaAs can be used as the substrate 106. Next, an insulating material of SiO$_2$, Si$_3$N$_4$ or the like serving as posts 103 and a spacer 104 is formed in a sputtering method, a CVD (Chemical Vapor Deposition) method or the like. Further, Si serving as a driving electrode 102 is deposited thereon in a CVD method or the like. Semiconductor materials such as Si, GaAs, etc. can be doped to be formed into a P type or an N type so as to reduce the resistance. P-type Si can be doped with boron, and N-type Si can be doped with phosphorus. Doping has an effect to reduce the resistance of the vibrator, that is, an effect to reduce the impedance or an effect to control the Young's modulus.

Figure 7B:
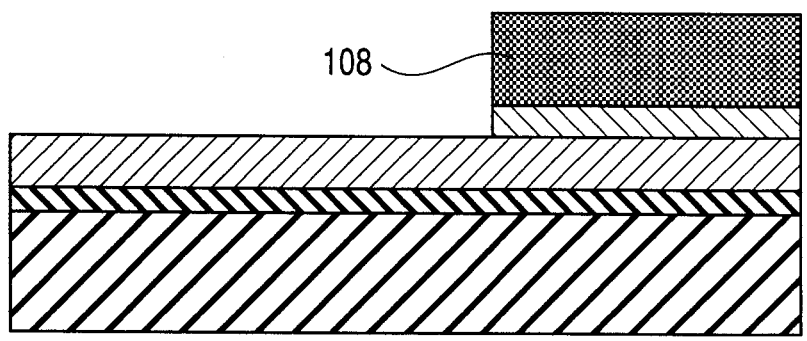

Next, a photo-resist 108 patterned by electron-beam lithography, photo-lithography or the like is formed on the doped silicon serving as the driving electrode 102 as shown in FIG. 7(b). The driving electrode 102 is formed by dry etching with this pattern as a mask.

Figure 7C:
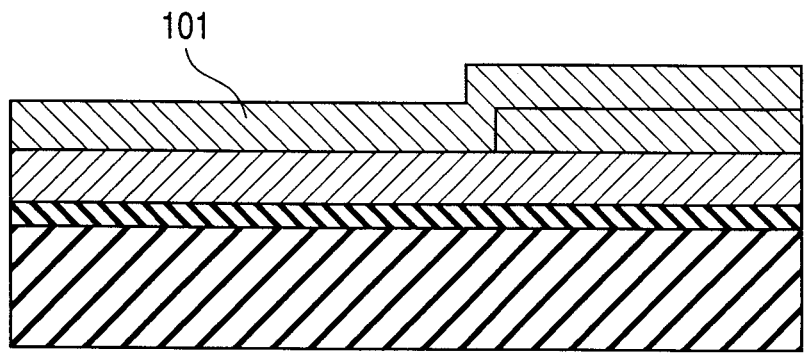
Figure 8A:
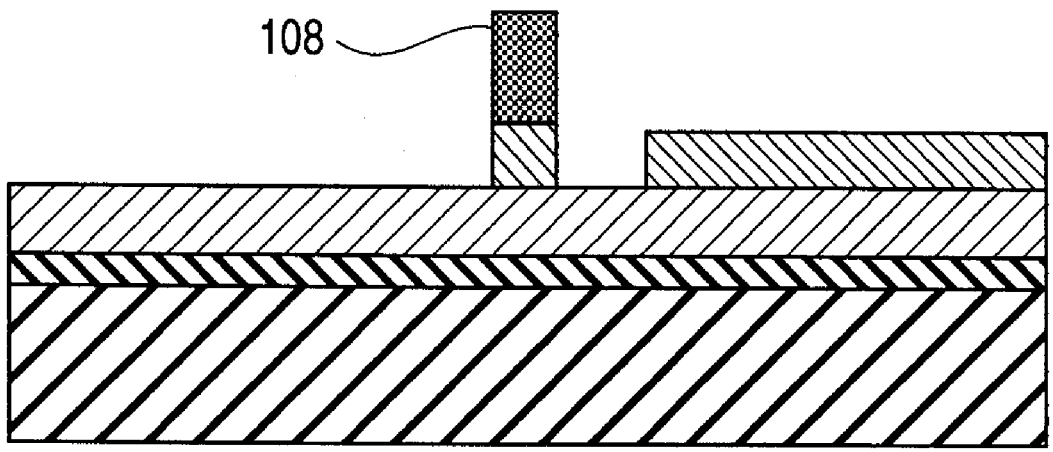
[FIG. 8] Sectional views for stepwise explaining a manufacturing process of the electromechanical signal selection device in FIG. 6 according to Embodiment 1 of the present invention.
Figure 8B:
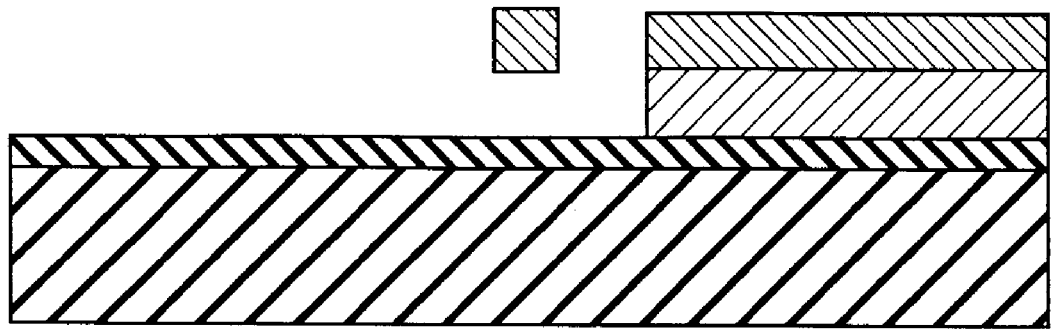

Next, a micro-vibrator 101 is formed. As shown in FIG. 7(c), the photo-resist 108 is removed by ashing, and a material serving as the micro-vibrator 101 is then deposited in a sputtering method, a CVD method or the like. Next, a photo-resist 108 patterned by electron-beam lithography, photo-lithography or the like is formed on the material serving as the micro-vibrator 101. The micro-vibrator 101 is formed by dry etching as shown in FIG. 8(a). Finally, the photo-resist 108 is removed by ashing, and the insulating material under the micro-vibrator 101 also having a function as a sacrificial layer is then removed by selective wet etching etc. with the material serving as the micro-vibrator 101. Thus, an aerial structure of the micro-vibrator 101 as shown in FIG. 8(b) is produced. HF or the like is used as etchant. In addition, after the selective wet etching, CO$_2$ supercritical drying is performed to avoid contact of the aerial structure with the substrate.

The material of the micro-vibrator 101 is similar to that in the aforementioned Embodiment 1. When the driving electrode 102 is composed of a semiconductor material, the driving electrode 102 formed in the same process as the micro-vibrator 101 in advance may be doped after or before patterning, so that only the resistance of the driving electrode 102 can be reduced selectively. Thus, the number of masks can be reduced, and the process can be simplified.

Further, the micro-vibrator 101 may be doped or modified to form a structure easy to produce a structural change. As the modification treatment, for example, there is a treatment etc. in which crystal distortion is formed by ion injection with a material having a large ionic radius.

As for the material of the driving electrode 102, a metal material such as aluminum, gold, copper or the like can be deposited by sputtering, vapor deposition or the like so as to form the driving electrode 102.

Also in this case, the insulating layer 105 does not have to be formed when it is guaranteed that there is no influence of the substrate 106 on loss of a high frequency signal.

In such a manner, according to the electromechanical signal selection device 100, 200, 300 or 400, only a signal of a predetermined frequency can be selectively output without providing any sensitive vibration sensing mechanism that has been difficult to realize in the related art. In addition, since it is not necessary to provide the sensitive vibration sensing mechanism, an electromechanical signal selection device which can be manufactured with a simple structure and at a low cost and which has a high frequency signal selection function is provided. Further, according to the electromechanical signal selection device 100 or 200, it is not necessary to provide a mechanism for giving an external force to a micro-vibrator to thereby excite vibration therein. It is therefore possible to manufacture the electromechanical signal selection device with a simpler structure and at a lower cost.

The electromechanical signal selection device according to Embodiment 1 is applicable as a filter device, a sampling device or a switching device.

The micro-vibrator where a high frequency signal should propagate may be formed to have a size of micrometer order in order to reduce the insertion loss.

Resonance of a harmonic mode of the micro-vibrator may be used to obtain a GHz band resonance frequency.

A plurality of electromechanical signal selection devices according to the present invention may be connected in parallel in order to reduce the insertion loss.

In addition, the electromechanical signal selection device according to the present invention is applicable not only to a wireless communication terminal but also to electrical equipment for various applications.

Further, the electromechanical signal selection device according to the present invention is applicable not only to an electric circuit for wireless communication but also to electric circuits for various applications.

Moreover, the electromechanical signal selection device according to the present invention can be also used for another application such as a resonator etc., and can be used in a block of an electric circuit such as an oscillator, a mixer, an amplifier or the like.

Embodiment 2

Figure 9A:
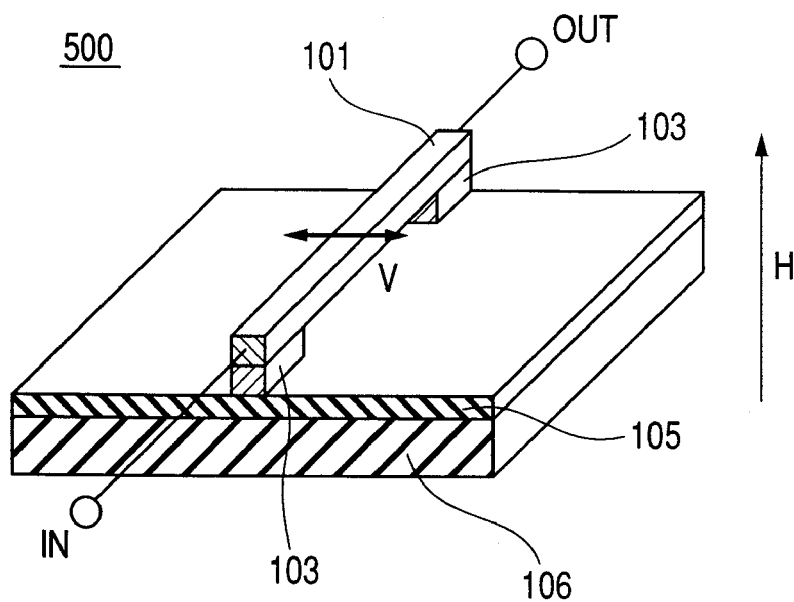
[FIG. 9] (a) is a perspective view showing the configuration of an electromechanical signal selection device according to Embodiment 2 of the present invention, and (b) is a perspective view showing a modification of the electromechanical signal selection device in FIG. 9(a).

FIG. 9(a) is a perspective view showing the configuration of an electromechanical signal selection device according to Embodiment 2 of the present invention. In the electromechanical signal selection device 500 shown in FIG. 9(a), a micro-vibrator 101 bridged between posts 103 is provided on a substrate 106 having an insulating layer 105 in the surface. A mechanism for applying an external magnetic field H to the micro-vibrator 101 is provided. A signal input port IN for signal input and a signal output port OUT for signal output are connected to the micro-vibrator 101. The mechanism for applying the external magnetic field H may be a mechanism for generating a magnetic field, such as a magnetic substance or a coil.

The micro-vibrator 101 is excited by an electrostatic force in the electromechanical signal selection device 100 or 200 according to Embodiment 1. However, the electromechanical signal selection device 500 according to Embodiment 2 uses a different exciting method to excite the micro-vibrator 101 by a Lorentz force.

Description will be made on a method for exciting the micro-vibrator in the electromechanical signal selection device 500. An external magnetic field H is applied to the micro-vibrator 101 in advance so that a Lorentz force is applied to the micro-vibrator 101 in a direction in which the micro-vibrator 101 is desired to vibrate. The vibrating direction of the micro-vibrator 101 is designated by V. In this case, the vector direction of the external magnetic field H is a vertical direction to the substrate. When a high frequency signal is input from the signal input port IN and an AC current flows into the micro-vibrator 101 due to the high frequency signal, a Lorentz force is applied to the micro-vibrator 101 due to the AC current and the external magnetic field H. The direction of the Lorentz force is changed over alternately in accordance with the direction of the AC current, and the frequency thereof is equal to the frequency of the high frequency signal. In such a manner, due to the high frequency signal, the Lorentz force is applied to the micro vibrator 101 so as to excite the micro-vibrator 101.

Next, description will be made on a mechanism for signal selection of the micro-vibrator in this electromechanical signal selection device 300. A signal input from the signal input port IN propagates to the micro-vibrator 101 and excites the micro-vibrator 101 in accordance with the frequency of the high frequency signal. Only when a signal with a frequency equal to the self-resonant frequency of the micro-vibrator 101 is input, the micro-vibrator 101 is excited with large amplitude so as to produce structural deformation of the micro-vibrator 101. The vibration of the micro-vibrator 101 can be used up to a harmonic mode of its self-resonant frequency. The vibrating direction of the micro-vibrator 101 varies in accordance with the excited vibration mode.

As the micro-vibrator 101 is smaller so that the vibration amplitude becomes smaller, it is more difficult to extract a signal in a vibration sensing method of a related-art electromechanical signal selection device which senses a variation of the vibration amplitude electrically. In the electromechanical signal selection device 300 according to the present invention, therefore, a new system is introduced as follows. That is, when the micro-vibrator 101 vibrates with its self-resonant frequency, a physical property of the micro-vibrator 101 changes due to a structural change of the micro-vibrator 101 so that a signal can be selected. This Embodiment 2 shows the case where a change of electric conduction characteristic is used as the change of the physical property.

FIG. 2 are views showing structural deformation of the micro-vibrator of the electromechanical signal selection device according to Embodiment 2 of the present invention. When the micro-vibrator 101 is not vibrating, as shown in FIG. 2(a), the structure of the micro-vibrator 101 is in a straight-line stationary state, and the crystal structure is also in an undistorted state where lattices 107 are arranged regularly with a lattice constant (a, b). On the other hand, in the state where the micro-vibrator 101 is excited with its self-resonant frequency, as shown in FIG. 2(b), the structure of the micro-vibrator 101 is in a curved vibrating state, and the crystal structure is in a distorted state where the lattices are arranged irregularly. In this case, the lattice constant has a value (a', b') varying locally so that the value becomes irregular to be b' in one site and b" in another site.

Figure 10A:
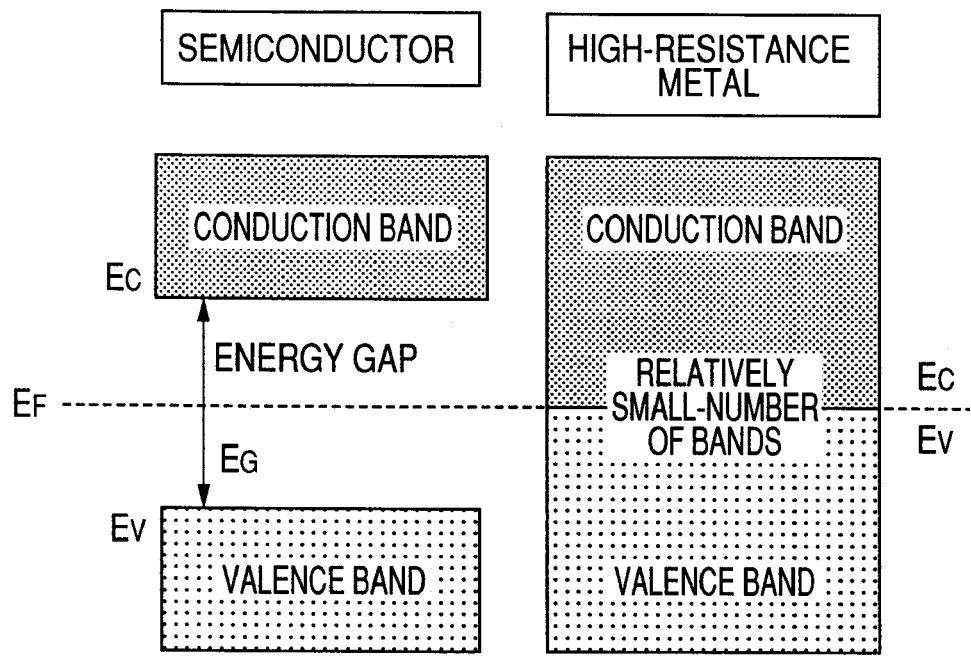
[FIG. 10] Diagrams showing the electron band structure of the micro-vibrator of the electromechanical signal selection device according to Embodiment 1 of the present invention: in which (a) is a diagram showing a stationary state of the micro-vibrator; and (b) is a diagram showing a vibrating state of the micro-vibrator.

In the electromechanical signal selection device 500 according to the present invention, a change of the electric conduction characteristic of the micro-vibrator 101 caused by a structural change of the micro-vibrator 101 is used as a mechanism for signal selection. To this end, a material whose electron band structure changes in accordance with the structural change is used as the micro-vibrator 101. In this Embodiment 2, an AC current has to flow to excite the micro-vibrator 101. Therefore, some degree of electric conductivity has to be provided in the stationary state where the micro-vibrator 101 is not vibrating. FIG. 10 are diagrams showing the electron band structure of the micro-vibrator of the electromechanical signal selection device according to Embodiment 2 of the present invention. FIG. 10(a) shows the electron band structure of the micro-vibrator 101 in the stationary state where the micro-vibrator 101 is not vibrating. In the state where no distortion occurs in the crystal structure of the micro-vibrator 101, the electric conduction characteristic of the micro-vibrator 101 is semiconductor or high-resistance metal. When the micro-vibrator 101 is a semiconductor, the micro-vibrator 101 has an electron band structure in which an energy gap $E_G$ is open between a valence band and a conduction band. Fermi energy $E_F$ contributing to electric conduction is located in the energy gap $E_G$. The energy gap $E_G$ is smaller than that in the case where the micro-vibrator 101 is an insulator. Accordingly, the electron band structure serves as a semiconductor in which carriers (electrons or positive holes) can move.

Figure 10B:
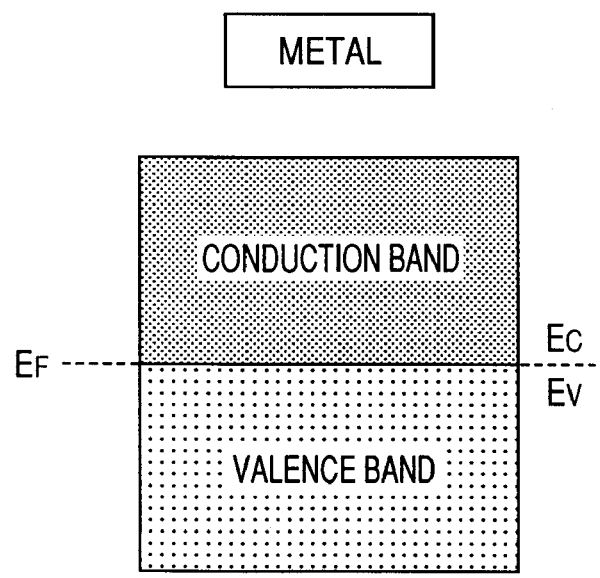

On the other hand, when the micro-vibrator 101 is comparatively high resistance metal, the micro-vibrator 101 has a metallic band structure in which the energy gap $E_G$ is absent between the valence band and the conduction band. However, the number of electron bands of the conduction band over the Fermi energy $E_F$ contributing to electric conduction is comparatively small. Therefore, the number of electrons which can be conducted becomes smaller than that in normal-resistance metal. Accordingly, the micro-vibrator 101 has a metallic electron beam structure with high resistance. On the other hand, FIG. 10(b) shows the electron band structure of the micro-vibrator 101 in the vibrating state where the micro-vibrator 101 is excited with its self-resonant frequency. In the state where distortion occurs in the crystal structure of the micro-vibrator 101 in the vibrating state where the micro-vibrator 101 is excited with its self-resonant frequency, the electron band structure of the micro-vibrator 101 changes due to the distortion so that the electric conduction characteristic becomes metallic. The energy gap $E_G$ between the valence band and the conduction band is absent, and many electron bands of the conduction band range over the Fermi energy $E_F$ contributing to electric conduction. Thus, the electron band structure changes into a metallic electron band structure.

When a signal with a frequency not equal to the self-resonant frequency of the micro-vibrator 101 is input from the signal input port IN, the micro-vibrator 101 is in a stationary state where the micro-vibrator 101 is not vibrating. Thus, the electric conduction characteristic of the micro-vibrator 101 is semiconductor or high-resistance metal. In this case, the signal cannot flow into the high-impedance micro-vibrator 101 sufficiently. Thus, the signal is not output to the signal output port OUT. On the other hand, when oscillation with a frequency equal to the self-resonant frequency of the micro-vibrator 101 is input from the signal input port IN, the micro-vibrator 101 is brought into a vibrating state where the micro-vibrator 101 is excited. Thus, the electric conduction characteristic thereof becomes metallic. In this case, the signal can flow into the micro-vibrator 101. Thus, the signal is output to the signal output port OUT. That is, only when a signal with a frequency equal to the self-resonant frequency of the micro-vibrator 101 is input from the signal input port IN, a signal with the same frequency can selectively pass to the signal output port OUT.

FIG. 4(a) is a graph showing the signal selection characteristic of the electromechanical signal selection device according to Embodiment 2 of the present invention. The electromechanical signal selection device can have a band-pass signal selection device characteristic with a center frequency $f_c$. The center frequency $f_c$ and a Q value depend on the design of the micro-vibrator 101, and are decided by the self-resonant frequency and the Q value of the micro-vibrator 101.

In this case, the relationship between the structural change of the micro-vibrator 101 and its electric conduction characteristic has been shown by way of example. However, at the time of the vibrating state where the micro-vibrator 101 is excited, the electric conduction characteristic may be in a low-impedance state such as a low-resistance semiconductor state or the like.

As for materials whose electron band structures can vary in accordance with the structural change, the same ones as those in Embodiment 1 can be used as the micro-vibrator 101.

Figure 9B:
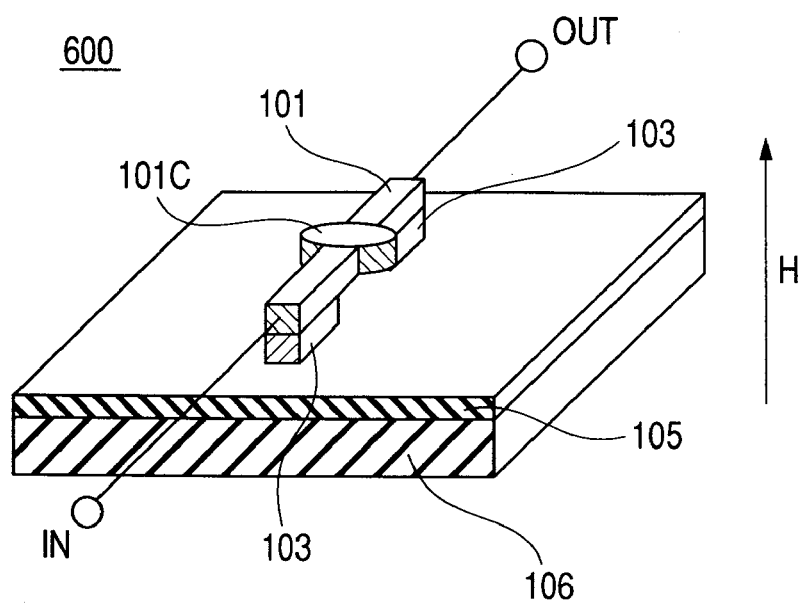

FIG. 9(b) is a perspective view showing a modification of the electromechanical signal selection device in FIG. 9(a). In the electromechanical signal selection device 500, a dual-supported beam is used as the micro-vibrator 110. However, in an electromechanical signal selection device 600 shown in FIG. 9(b), a disc is used by way of example. In the same manner, various other shapes such as a cantilever, a square board, etc. can be used as the micro-vibrator 110. In the electromechanical signal selection device 600 in FIG. 9(b), constituents similar to those in the electromechanical signal selection device 500 shown in FIG. 9(a) are named and referenced correspondingly, and description thereof will be omitted.

In the electromechanical signal selection device according to Embodiment 2 of the present invention, a material having a negative correlation between its structural change and its electric conduction characteristic, that is, a material showing low impedance like metal, low-resistance semiconductor or the like in a stationary state and high impedance like semiconductor, high-resistance metal or the like in a vibrating state, may be used as the micro-vibrator 101. Thus, the electromechanical signal selection device can have a band stop signal selection device characteristic at a center frequency $f_c$ as shown in FIG. 4(b).

A power amplifier etc. for amplifying the power of an output signal can be provided on the signal output port OUT side.

When a plurality of micro-vibrators are combined mechanically, it is possible to control the Q value of the signal selection characteristic or the signal pass bandwidth.

Electromechanical signal selection devices according to the present invention may be connected in parallel or in series to form a multistage signal selection device configuration.

Embodiment 2 has showed the case where the vibrating direction of the micro-vibrator is horizontal with respect to the substrate. However, various directions including a vertical direction can be set as the vibrating direction. A mechanism to apply the external magnetic field H can be disposed or the direction to apply the magnetic field H can be controlled to apply the exciting force to the micro-vibrator in a desired direction.

Each electromechanical signal selection device 500, 600 can be manufactured in a manufacturing method similar to the manufacturing method of the electromechanical signal selection device 100, 200 according to Embodiment 1 of the present invention.

In such a manner, according to the electromechanical signal selection device 500, 600, only a signal of a predetermined frequency can be selectively output without providing any sensitive vibration sensing mechanism that has been difficult to realize in the related art. In addition, since it is not necessary to provide the sensitive vibration sensing mechanism, an electromechanical signal selection device which can be manufactured with a simple structure and at a low cost and which has a high frequency signal selection function is provided. Further, it is not necessary to provide a mechanism for giving an external force to a micro-vibrator to thereby excite vibration therein. It is therefore possible to manufacture the electromechanical signal selection device with a simpler structure and at a lower cost.

Embodiment 3

Figure 11A:
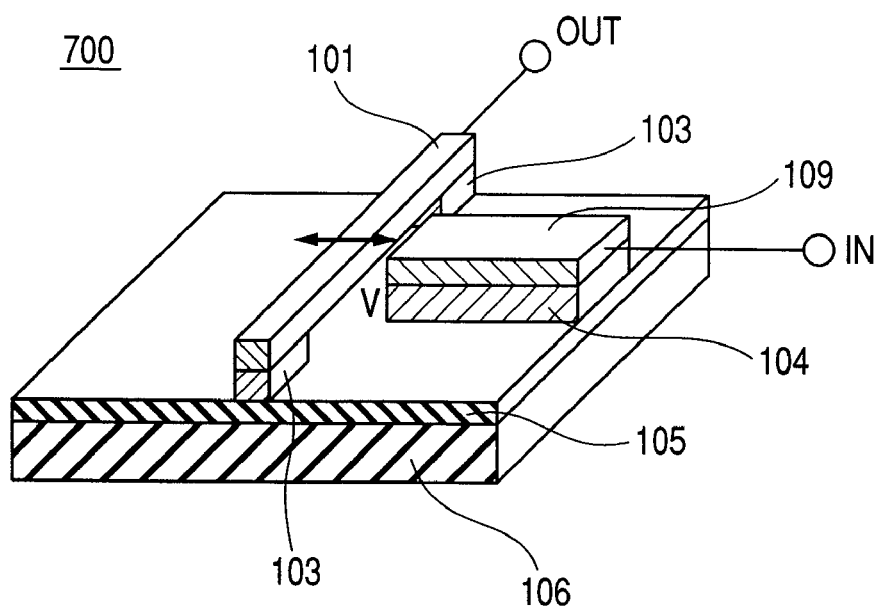
[FIG. 11] (a) is a perspective view showing the configuration of an electromechanical signal selection device according to Embodiment 3 of the present invention, and (b) is a perspective view showing a modification of the electromechanical signal selection device in FIG. 11(a).

FIG. 11(a) is a perspective view showing the configuration of an electromechanical signal selection device according to Embodiment 3 of the present invention. In the electromechanical signal selection device 700 shown in FIG. 11(a), a micro-vibrator 101 bridged between posts 103 and made of PZT, and a signal input electrode 109 provided on a spacer 104 are provided on a substrate 106 having an insulating layer 105 formed in the surface. A signal input port IN for signal input is connected to the signal input electrode 109 and a signal output port OUT for signal output is connected to the micro-vibrator 101. There is formed a mechanism in which when a high frequency signal is input from the signal input port IN, there occurs a potential difference between the signal input electrode 109 and the micro-vibrator 101 so that an electrostatic force is applied to the micro-vibrator 101 with the same frequency as that of the high frequency signal. The vibrating direction of the micro-vibrator 101 is designated by V. FIG. 11(a) shows the case where the vibrating direction V of the micro-vibrator 101 is horizontal with respect to the substrate. However, various directions including a vertical direction can be set as the vibrating direction. The signal input electrode 109 can be disposed to apply an exciting force to the micro-vibrator in a desired direction.

Next, description will be made on a mechanism for signal selection of the micro-vibrator in this electromechanical signal selection device 700. There is shown a longitudinal sectional view showing the configuration of the electromechanical signal selection device which uses PZT as the micro-vibrator. A signal input from the signal input port IN propagates to the signal input electrode 109 and excites the micro-vibrator 101 in accordance with the frequency of the high frequency signal. Only when a signal with a frequency equal to the self-resonant frequency of the micro-vibrator 101 is input, the micro-vibrator 101 is excited with large amplitude so as to produce structural deformation of the micro-vibrator 101. The vibration of the micro-vibrator 101 can be used up to a harmonic mode of its self-resonant frequency. The vibrating direction of the micro-vibrator 101 varies in accordance with the excited vibration mode.

As the micro-vibrator 101 is smaller so that the vibration amplitude becomes smaller, it is more difficult to extract a signal in a vibration sensing method of a related-art electromechanical signal selection device which senses a variation of the vibration amplitude electrically. In the electromechanical signal selection device 700 according to the present invention, therefore, a new system is introduced as follows. That is, when the micro-vibrator 101 vibrates with its self-resonant frequency, a physical property of the micro-vibrator 101 changes due to a structural change of the micro-vibrator 101 so that a signal can be selected. This Embodiment 3 shows the case where piezoelectric effect is used as the change of the physical property.

As for the structural deformation of the micro-vibrator of the electromechanical signal selection device according to Embodiment 3 of the present invention, there also occurs a phenomenon as shown in FIG. 2. When the micro-vibrator 101 is not vibrating, as shown in FIG. 2(a), the structure of the micro-vibrator 101 is in a straight-line stationary state, and the crystal structure is also in an undistorted state where lattices 107 are arranged regularly with a lattice constant (a, b). On the other hand, in the state where the micro-vibrator 101 is excited with its self-resonant frequency, as shown in FIG. 2(b), the structure of the micro-vibrator 101 is in a curved vibrating state, and the crystal structure is in a distorted state where the lattices are arranged irregularly. In this case, the lattice constant has a value (a', b') varying locally so that the value becomes irregular to be b' in one site and b" in another site.

In the electromechanical signal selection device 700 according to the present invention, the piezoelectric effect caused by a structural change of the micro-vibrator 101 is used as a mechanism for signal selection. To this end, a piezoelectric material is used as the micro-vibrator 101. When a signal with a frequency not equal to the self-resonant frequency of the micro-vibrator 101 is input from the signal input port IN, the micro-vibrator 101 is in a stationary state where the micro-vibrator 101 is not vibrating. On the other hand, when oscillation with a frequency equal to the self-resonant frequency of the micro-vibrator 101 is input from the signal input port IN, the micro-vibrator 101 is brought into a vibrating state where the micro-vibrator 101 is excited. Thus, piezoelectric effect occurs due to the distortion of the micro-vibrator 101. In this case, an AC voltage with a frequency equal to the self-resonant frequency of the micro-vibrator 101 is generated due to the piezoelectric effect so that a signal is output to the signal output port OUT. That is, only when a signal with a frequency equal to the self-resonant frequency of the micro-vibrator 101 is input from the signal input port IN, a signal with the same frequency can be selectively output to the signal output port OUT.

The electromechanical signal selection device according to Embodiment 3 of the present invention can also have a band-pass signal selection device characteristic with a center frequency $f_c$ as shown by the signal selection characteristic in FIG. 4(a). Also here, the center frequency $f_c$ and a Q value depend on the design of the micro-vibrator 101, and are decided by the self-resonant frequency and the Q value of the micro-vibrator 101.

Not only piezoelectric materials such as PZT but also dielectric materials, carbon-based materials such as carbon nanotubes, insulating materials such as $SiO_2$ and $Si_3N_4$, ceramics such as $La_{1-x}Sr_xMnO_3$ and $PrNiO_3$, organic materials such as $(DMe\text{-}DCNQI)_2Cu$, composite materials having quantum dots or the like implanted, materials showing piezoelectric effect due to crystal distortion, such as superlattice materials having a plurality of materials laminated, can be used as the piezoelectric material of the micro-vibrator 101.

Figure 11B:
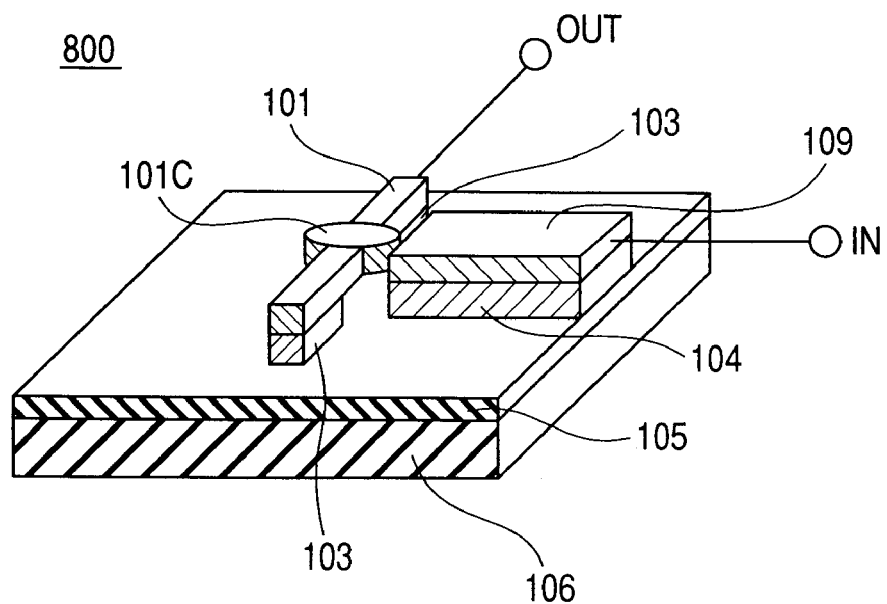

FIG. 11(b) is a perspective view showing a modification of the electromechanical signal selection device in FIG. 11(a). In the electromechanical signal selection device 700, a dual-supported beam is used as the micro-vibrator 101. However, in an electromechanical signal selection device 800 shown in FIG. 11(b), a disc is used by way of example. In the same manner, various other shapes such as a cantilever, a square board, etc. can be used as the micro-vibrator 101. In the electromechanical signal selection device 800 in FIG. 11(b), constituents similar to those in the electromechanical signal selection device 700 shown in FIG. 11(a) are named and referenced correspondingly, and description thereof will be omitted.

A power amplifier etc. for amplifying the power of an output signal can be provided on the signal output port OUT side.

When a plurality of micro-vibrators are combined mechanically, it is possible to control the Q value of the signal selection characteristic or the signal pass bandwidth.

Electromechanical signal selection devices according to the present invention may be connected in parallel or in series to form a multistage signal selection device configuration.

Each electromechanical signal selection device 700, 800 can be manufactured in a manufacturing method similar to the manufacturing method of the electromechanical signal selection device 100, 200 according to Embodiment 1 of the present invention.

In such a manner, according to the electromechanical signal selection device 700, 800, only a signal of a predetermined frequency can be selectively output without providing any sensitive vibration sensing mechanism that has been difficult to realize in the related art. In addition, since it is not necessary to provide the sensitive vibration sensing mechanism, an electromechanical signal selection device which can be manufactured with a simple structure and at a low cost and which has a high frequency signal selection function is provided.

Embodiment 4

Figure 12A:
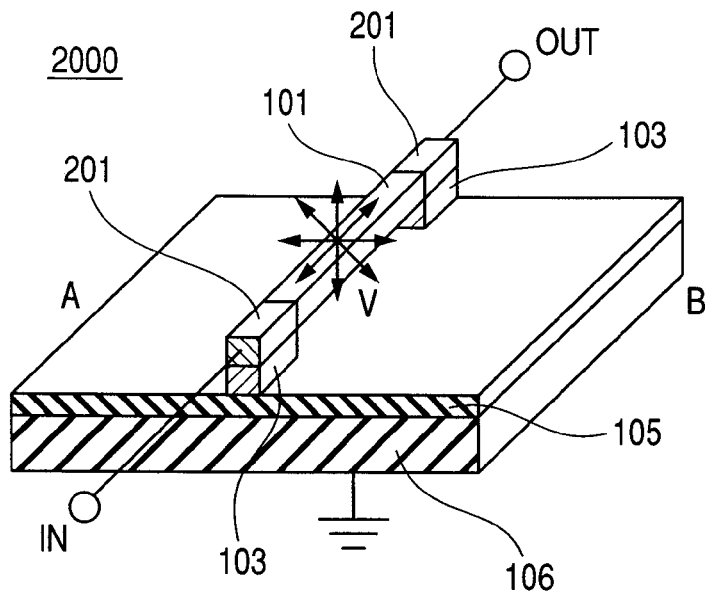
[FIG. 12] (a) is a perspective view showing the configuration of an electromechanical signal selection device according to Embodiment 4 of the present invention, and (b) is a perspective view showing the configuration of an electromechanical signal selection device according to a modification of Embodiment 4 of the present invention.

FIG. 12(a) is a perspective view showing the configuration of an electromechanical signal selection device according to Embodiment 4 of the present invention. In the electromechanical signal selection device 2000 shown in FIG. 12(a), a micro-vibrator 10 bridged between electrodes 201 formed on posts 103 is provided. A signal input port IN for signal input and a signal output port OUT for signal output are connected to the micro-vibrator 101. There is formed a mechanism in which when a high frequency signal is input to the signal input port IN, there occurs a potential difference between the micro-vibrator 101 and a grounded substrate 106 so that an electrostatic force is applied to the micro-vibrator 101 with the same frequency as that of the high frequency signal.

The micro-vibrator 101 does not have any portion fixed onto the posts 103. Accordingly, the micro-vibrator 101 is aerial and throughout movable so that a change in physical properties including structural deformation and electric conduction characteristic caused by vibration can be given to the whole of the micro-vibrator 101.

This structure can be manufactured only by adding a step of depositing and patterning a material of the electrode 201 to the manufacturing process shown in Embodiment 1. The material of the electrode 201 is a conductive material containing a metal material including Al or Au and a doped silicon.

Figure 12B:
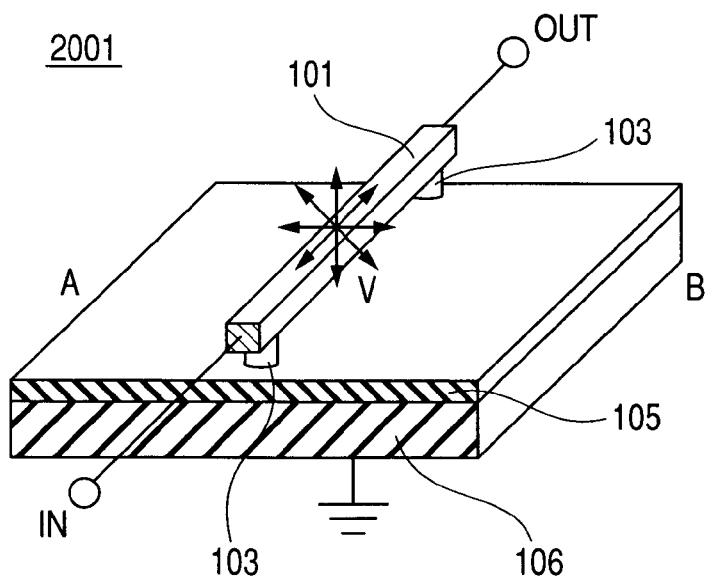

FIG. 12(b) is a perspective view showing the configuration of a modification of the electromechanical signal selection device according to Embodiment 4 of the present invention. In an electromechanical signal selection device 2001 shown in FIG. 12(b), a micro-vibrator 101 bridged between posts 103 is provided. The structure of each post 103 has a thin columnar shape in which the area of the fixation portion abutting against the micro-vibrator 101 is reduced.

Since the micro-vibrator 101 is flexibly fixed onto the posts 103, the micro-vibrator 101 is throughout movable so that a change in physical properties including structural deformation and electric conduction characteristic caused by vibration can be given to the whole of the micro-vibrator 101.

This structure can be formed as follows. That is, the posts 103 to be formed out of an insulating material such as $SiO_2$ or $Si_3N_4$ is etched by isotropic wet-etching or dry-etching while the etching time is optimized.

Embodiment 5

Figure 13:
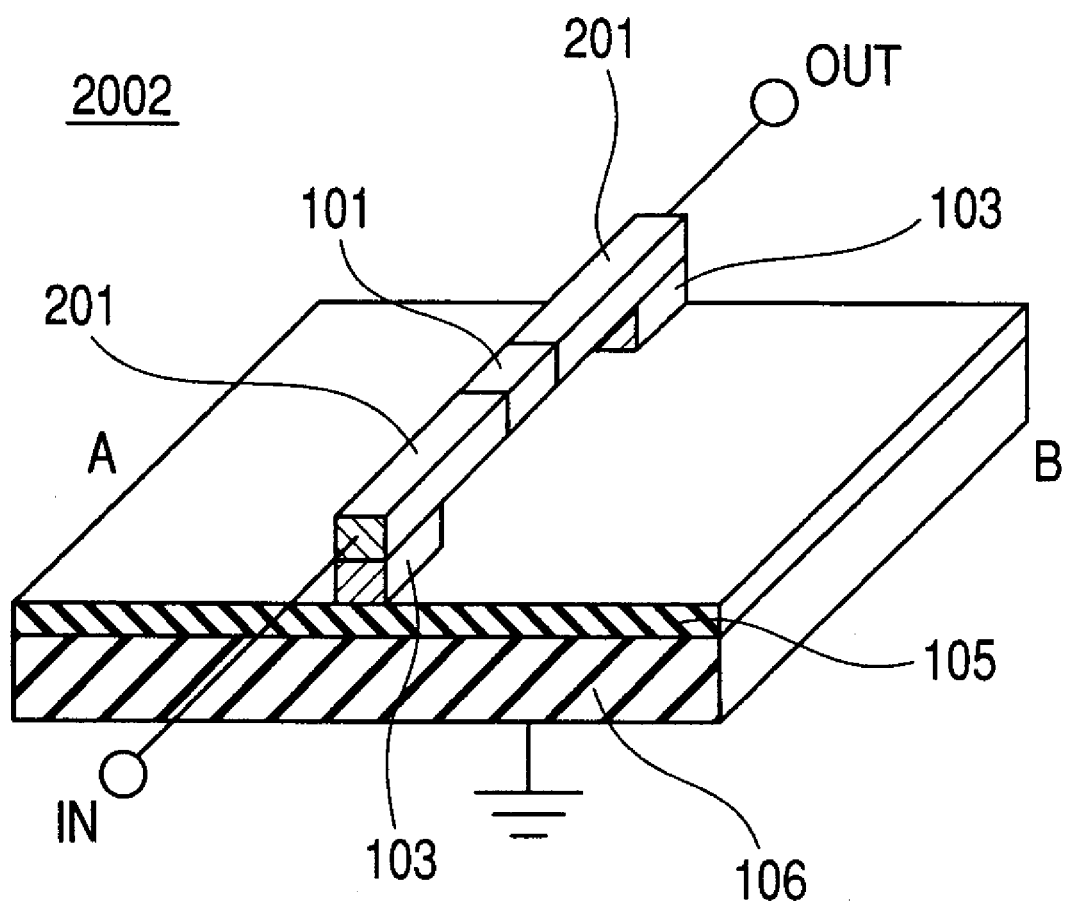
[FIG. 13] (a) is a perspective view showing the configuration of an electromechanical signal selection device according to Embodiment 5 of the present invention.

FIG. 13 is a perspective view showing the configuration of an electromechanical signal selection device according to Embodiment 5 of the present invention. In an electromechanical signal selection device 2002 shown in FIG. 13, a vibrating portion bridged between posts 103 is constituted by electrodes 201 and a micro-vibrator 101. Apart of a displaceable portion floating in the air is the micro-vibrator 101 formed out of a material in which a change in electric conduction characteristic occurs due to vibration.

In this structure, uniform or varied distortion can be provided all over the micro-vibrator 101. Signal selection is performed by a change in the electric conduction characteristic of the micro-vibrator 101 formed in a part of the vibrating portion.

This structure is manufactured by changing a mask pattern of the electrodes 201 and the micro-vibrator 101 in the manufacturing process of FIG. 12(a).

Embodiment 6

Figure 14A:
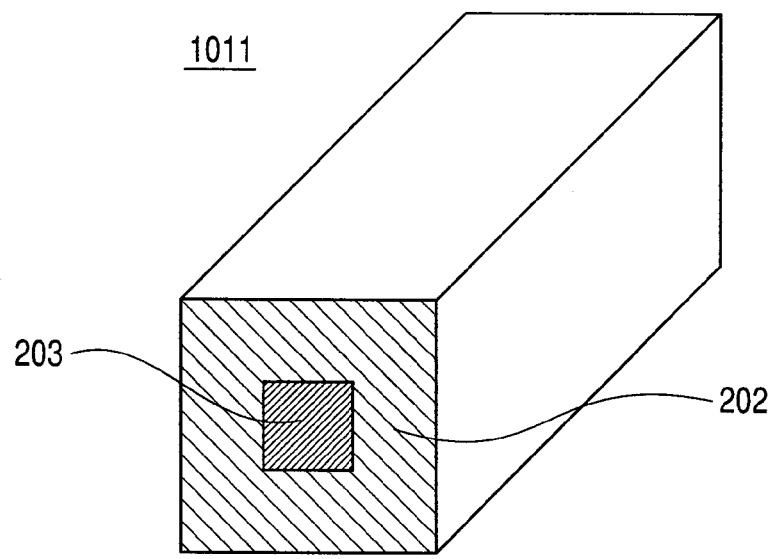
[FIG. 14] (a) is a perspective view showing the structure of a micro-vibrator according to Embodiment 6 of the present invention, and (b) is a perspective view showing the structure of a micro-vibrator according to a modification of Embodiment 6 of the present invention.

FIG. 14(a) is a main portion enlarged perspective view showing the configuration of a micro-vibrator according to Embodiment 6 of the present invention. A micro-vibrator 1011 shown in FIG. 14(a) has a laminated structure in which a phase-change material layer 202 showing a change in physical property in accordance with a structure change is formed on the surface of a linear conductor layer 203.

A high frequency signal flowing in the conductor 203 chiefly serves to excite the micro-vibrator 1011, and a high frequency signal flowing in the phase-change material layer 202 serves to select a signal in accordance with a change in physical property including electric conduction characteristic.

The high frequency signal input to the micro-vibrator 1011 has a characteristic called skin effect. That is, as the frequency of the signal is higher, the signal flows more closely to the surface. The conductor layer 203 may be formed into a shape in which at least half the radius thereof is not larger than the skin depth of the high frequency signal so that the signal power attenuation factor is increased. Thus, the signal is allowed to pass when the micro-vibrator 1011 vibrates so that the micro-vibrator 1011 as a whole including the phase-change material layer 202 is in a low resistance state. In this case, the micro-vibrator 1011 may be formed into a shape in which at least the radius thereof is not smaller than the skin depth of the high frequency signal so that the signal power attenuation factor is reduced.

Figure 14B:
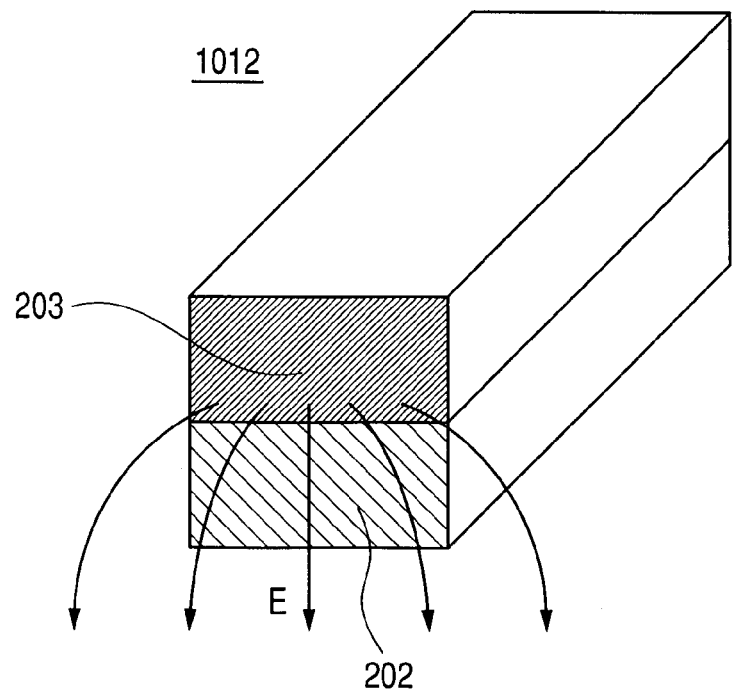

FIG. 14(b) is a perspective view showing the configuration of a modification of the micro-vibrator according to Embodiment 6 of the present invention. A micro-vibrator 1012 shown in FIG. 14(b) has a laminated structure in which the phase change material layer 202 showing a change in physical property caused by a structural change is formed on the substrate side under the conductor layer 203.

A high frequency signal flowing in the conductor layer 203 chiefly serves to excite the micro-vibrator 1011, and a high frequency signal flowing in the phase-change material layer 202 serves to select a signal in accordance with a change in physical property including electric conduction characteristic.

When the phase change material layer 202 is formed on the substrate grounded side where an electric field E of the high frequency signal is concentrated, the effect of signal selection using a change in electric conduction characteristic of the phase change material layer 202 can be increased.

The phase change material layer 202 can be formed with respect to the conductor layer 203 desirably on the side where the electric field of the high frequency signal is concentrated.

The high frequency signal input to the micro-vibrator 1012 has a characteristic called skin effect. That is, as the frequency of the signal is higher, the signal flows more closely to the surface. The conductor layer 203 may be formed into a shape in which at least half the radius thereof is not larger than the skin depth of the high frequency signal so that the signal power attenuation factor is increased. Thus, the signal is allowed to pass when the micro-vibrator 1012 vibrates so that the micro-vibrator 1012 as a whole including the phase-change material layer 202 is in a low resistance state. In this case, the micro-vibrator 1012 may be formed into a shape in which at least the radius thereof is not smaller than the skin depth of the high frequency signal so that the signal power attenuation factor is reduced.

The laminated structure of the micro-vibrator 1011 can be formed into a laminated structure with a plurality of at least two layers.

The structures of the electromechanical signal selection device and the micro-vibrator according to this Embodiment 6 can be applied to the electromechanical signal selection devices 100, 200, 300, 400, 500, 600, 700 and 800 according to Embodiments 1, 2 and 3.

Embodiment 7

Figure 15A:
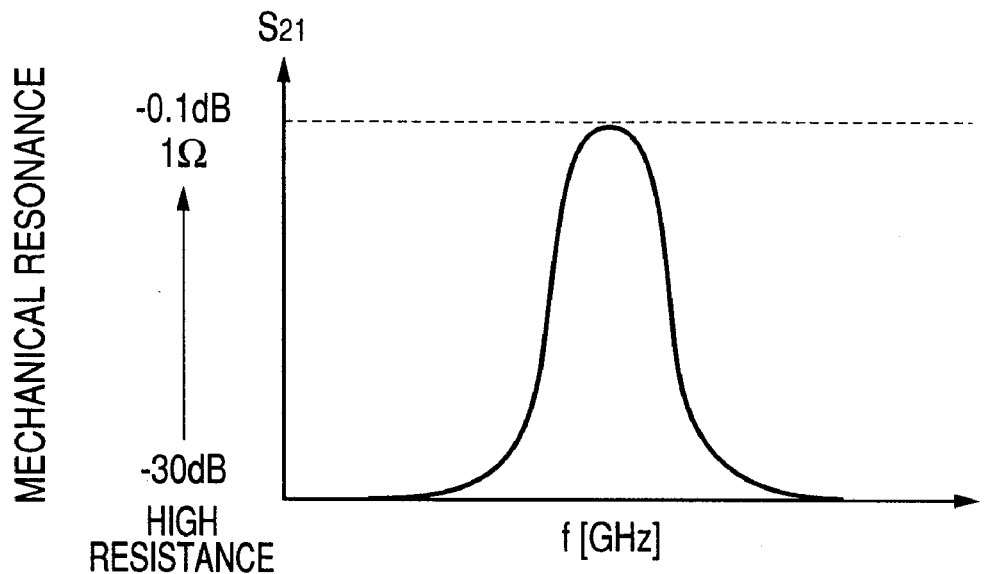
[FIG. 15] Graphs showing signal selection characteristics according to Embodiment 7 of the present invention: in which (a) is a graph showing the case where the material of a micro-vibrator 101 shows a linear or nonlinear change in electric conduction characteristic with respect to distortion; and (b) is a graph showing the case where the material of the micro-vibrator 101 shows an ON/OFF type change in electric conduction characteristic with respect to distortion.
Figure 15B:
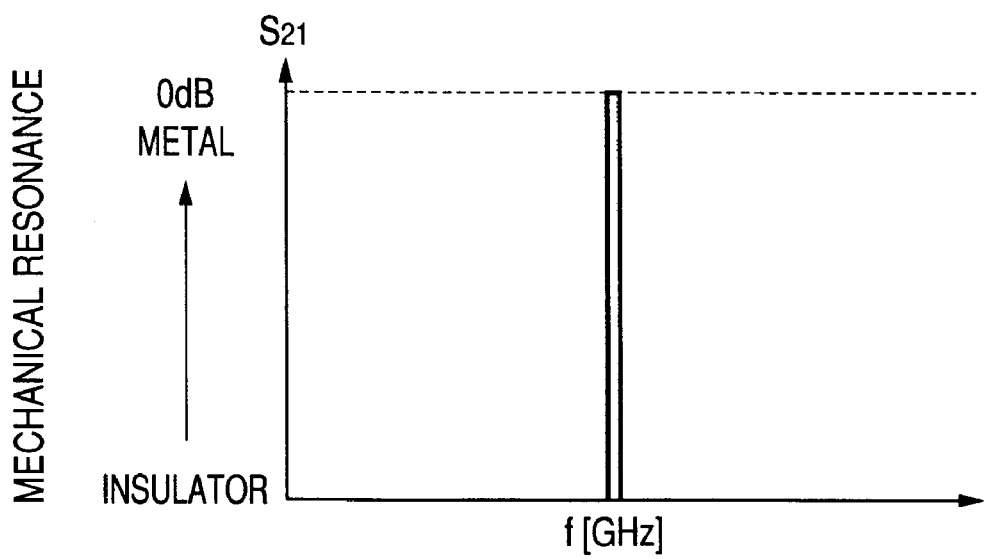

FIG. 15 are graphs showing the signal selection characteristic according to Embodiment 7 of the present invention. FIG. 15(*a*) shows the case where the material of the micro-vibrator 101 shows a linear or nonlinear change in electric conduction characteristic with respect to distortion. Assume that isolation is not lower than −30 dB when the micro-vibrator 101 which is not vibrating is in a high resistance state, and the resistance of the micro-vibrator which is mechanically resonating is not higher than 1 Ω. In this case, −0.1 dB or less of loss in insertion can be obtained. Such a characteristic is shown when a piezoresistive effect material or the like is used as the material of the micro-vibrator 101.

FIG. 15(*b*) shows the case where the material of the micro-vibrator 101 shows an ON/OFF type change in electric conduction characteristic with respect to distortion. Assume that isolation is high when the micro-vibrator 101 which is not vibrating is an insulator, and the micro-vibrator which is mechanically resonating is brought into a low-resistance metallic state. In this case, about 0 dB of loss in insertion can be obtained. Such a characteristic is shown when a metal-insulator transition material etc. containing perovskite type transition metal oxide is used as the material of the micro-vibrator 101.

INDUSTRIAL APPLICABILITY

In an electromechanical signal selection device according to the present invention, signal selection can be attained by a change in physical property caused by a structural change of a micro-vibrator generated when the micro-vibrator vibrates with its self-resonant frequency. The present invention is useful as an electromechanical signal selection device with a high frequency signal selection function, which can be manufactured with a simple structure and at a low cost, and electric equipment using the same electromechanical signal selection device.

The invention claimed is:

1. An electromechanical signal selection device comprising:
  a micro-vibrator which can be excited by an input signal; and
  a post for retaining the micro-vibrator,
  wherein the physical property of the micro-vibrator changes in accordance with a crystal structural change of the micro-vibrator when excited so as to select a signal.

2. The electromechanical signal selection device according to claim 1, wherein the physical property is an electric conduction characteristic.

3. The electromechanical signal selection device according to claim 1, wherein the post comprises a structure having lower rigidity than that of the micro-vibrator.

4. The electromechanical signal selection device according to claim 1, wherein the micro-vibrator comprises a multilayer structure of at least two layers including a material layer generating the change in physical property and a conductor layer.

5. The electromechanical signal selection device according to claim 4, wherein the material layer generating the change in physical property is formed on the side where an electric field of a signal is concentrated.

6. The electromechanical signal selection device according to claim 1, wherein the micro-vibrator comprises perovskite type transition metal oxide.

7. The electromechanical signal selection device according to claim 6, wherein the perovskite type transition metal oxide is $PrNiO_3$ showing metal-insulator transition.

8. The electromechanical signal selection device according to claim 1, wherein the microvibrator comprises a piezoresistive effect material.

9. The electromechanical signal selection device according to claim 8, wherein the microvibrator comprises at least one of Si, $La_{1-x}Sr_xMnO_3$ and $BaTiO_3$.

10. The electromechanical signal selection device according to claim 1, wherein the microvibrator comprises a superconductor.

11. The electromechanical signal selection device according to claim 10, wherein the superconductor is one of Air Pb, $La_{2-x}Sr_xCuO_4$ and $(BEDTTTF)_2I_3$.

12. The electromechanical signal selection device according to claim 1, wherein the microvibrator comprises a carbon-based material.

13. The electromechanical signal selection device according to claim 1, wherein the input signal is supplied through an electrode provided in the micro-vibrator.

14. The electromechanical signal selection device according to claim 1, wherein the change in physical property is caused by piezoelectric effect.

15. The electromechanical signal selection device according to claim 14, wherein the microvibrator is designed to generate a signal by virtue of the piezoelectric effect when the microvibrator is excited to produce a structural change.

16. The electromechanical signal selection device according to claim 1, wherein the microvibrator comprises ceramics.

17. The electromechanical signal selection device according to claim 16, wherein the microvibrator comprises PZT.

18. An electromechanical signal selection device comprising:
  a micro-vibrator which can be excited by an input signal; and
  a post for retaining the microvibrator,
  wherein the physical property of the micro-vibrator changes when excited so as to select a signal, and
  wherein the microvibrator is retained by an electrode placed on the post.

19. The electromechanical signal selection device according to claim 18, wherein a bonded surface between the electrode and the microvibrator is located at a distance from the post.

20. An electromechanical signal selection device comprising:
  a micro-vibrator which can be excited by an input signal; and
  a post for retaining the microvibrator,
  wherein the physical property of the micro-vibrator changes when excited so as to select a signal,
  wherein the microvibrator comprises a multilayer structure of at least two layers including a material layer generating the change in physical property and a conductor layer,
  wherein the conductor is formed to be linear, and wherein the material layer generating the change in physical property is formed around the linear conductor layer.

21. An electromechanical signal selection device comprising:

a microvibrator which can be excited by an input signal; and a post for retaining the micro-vibrator, wherein the physical property of the micro-vibrator changes when excited so as to select a signal, wherein the microvibrator comprises a multilayer structure of at least two layers including a material layer generating the change in physical property and a conductor layer, wherein the material layer generating the change in physical property is formed on the side where an electric field of a signal is concentrated, and wherein the material layer generating the change in physical property is formed under the substrate side of the conductor layer.

22. An electromechanical signal selection device comprising:

a micro-vibrator which can be excited by an input signal; and a post for retaining the micro-vibrator, wherein the physical property of the microvibrator changes when excited so as to select a signal, wherein the microvibrator comprises a multilayer structure of at least two layers including a material layer generating the change in physical property and a conductor layer, and wherein half the radius of the conductor is not larger than skin depth of a high frequency signal.

23. An electromechanical signal selection device comprising:

a micro-vibrator which can be excited by an input signal; and a post for retaining the micro-vibrator, wherein the physical property of the micro-vibrator changes when excited so as to select a signal, and wherein the input signal is supplied through a driving electrode disposed adjacently to the microvibrator.

24. The electromechanical signal selection device according to claim 23, wherein an external force to be applied to the driving electrode is an electrostatic force.

25. An electromechanical signal selection device comprising:

a micro-vibrator which can be excited by an input signal; and a post for retaining the microvibrator, wherein the physical property of the microvibrator changes when excited so as to select a signal, and wherein a mechanism for applying an external magnetic field to the microvibrator is provided to excite the microvibrator due to a Lorentz force.

26. An electromechanical signal selection device comprising:

a micro-vibrator which can be excited by an input signal; and a post for retaining the microvibrator, wherein the physical property of the micro-vibrator changes when excited so as to select a signal, and wherein a mechanism for applying an external, magnetic field is provided in a driving electrode or a signal input electrode disposed adjacently to the micro-vibrator so as to excite vibration of the microvibrator in a desired direction.

* * * * *

UNITED STATES PATENT AND TRADEMARK OFFICE
CERTIFICATE OF CORRECTION

PATENT NO.       : 7,551,044 B2
APPLICATION NO.  : 10/598844
DATED            : June 23, 2009
INVENTOR(S)      : Yasuyuki Naito Page 1 of 1

It is certified that error appears in the above-identified patent and that said Letters Patent is hereby corrected as shown below:

In Column 7, line 59, please delete "100200" and insert therefor --100,200--.

In Column 24, line 19, please delete "Air" and insert therefor --A1--.

Signed and Sealed this

Third Day of November, 2009

David J. Kappos
*Director of the United States Patent and Trademark Office*